(12) United States Patent
Sugimae et al.

(10) Patent No.: US 7,015,550 B2
(45) Date of Patent: Mar. 21, 2006

(54) NONVOLATILE SEMICONDUCTOR MEMORY DEVICE

(75) Inventors: Kikuko Sugimae, Yokohama (JP); Hiroyuki Kutsukake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 10/885,613

(22) Filed: Jul. 8, 2004

(65) Prior Publication Data

US 2005/0036353 A1 Feb. 17, 2005

(30) Foreign Application Priority Data

Jul. 9, 2003 (JP) .............................. 2003-194396
Jun. 28, 2004 (JP) .............................. 2004-189817

(51) Int. Cl.
*H01L 29/76* (2006.01)
(52) U.S. Cl. ...................... 257/365; 257/202; 257/249; 257/250; 257/270; 257/314; 257/315
(58) Field of Classification Search ................ 257/314, 257/315, 365, 270, 250, 249, 202
See application file for complete search history.

(56) References Cited

U.S. PATENT DOCUMENTS

| 5,115,288 | A  | * | 5/1992  | Manley ...................... 257/316 |
| 6,191,975 | B1 |   | 2/2001  | Shimizu et al. |
| 6,432,773 | B1 | * | 8/2002  | Gerber et al. ............... 438/261 |
| 6,493,264 | B1 |   | 12/2002 | Yamauchi |
| 6,667,507 | B1 | * | 12/2003 | Shirota et al. ............... 257/315 |
| 6,720,612 | B1 |   | 4/2004  | Takeuchi et al. |
| 6,788,573 | B1 | * | 9/2004  | Choi ...................... 365/185.05 |
| 6,894,341 | B1 | * | 5/2005  | Sugimae et al. ............ 257/315 |
| 2002/0040992 | A1 |  | 4/2002 | Manabe et al. |

FOREIGN PATENT DOCUMENTS

| JP | 11-145429   | 5/1999  |
| JP | 11-177070   | 7/1999  |
| JP | 11-238814   | 8/1999  |
| JP | 2000-188384 | 7/2000  |
| JP | 2001-284555 | 10/2001 |

(Continued)

OTHER PUBLICATIONS

Y. Sasago, et al., IEEE IEDM, pp. 952-954, "10-MB/S Multi-Level Programming of GB-Scale Flash Memory Enabled by New AG-and Cell Technology", 2002.

*Primary Examiner*—Christian D. Wilson
*Assistant Examiner*—Douglas M. Menz
(74) *Attorney, Agent, or Firm*—Oblon, Spivak, McClelland, Maier & Neustadt, P.C.

(57) ABSTRACT

A memory cell and a selection transistor for selecting the memory cell are provided. The memory cell includes a floating gate formed on a semiconductor substrate via a first gate insulation film, a pair of first diffusion layers positioned on the opposite sides of the floating gate and formed in the substrate, first and second control gates formed on the opposite sides of the floating gate to drive the floating gate, and an inter-gate insulation film formed between the first and second control gates and the floating gate. The selection transistor includes a selection gate•wiring including a first portion constituted of the same conductive layer as the first conductive layer, and a second portion constituted of the same conductive layer as the second conductive layer, and a second diffusion layer formed in the substrate, facing the second portion of the selection gate•wiring.

12 Claims, 24 Drawing Sheets

FOREIGN PATENT DOCUMENTS

| | | |
|---|---|---|
| JP | 2002-50703 | 2/2002 |
| JP | 2002-217318 | 8/2002 |
| JP | 2002-280463 | 9/2002 |
| JP | 2003-60092 | 2/2003 |

* cited by examiner

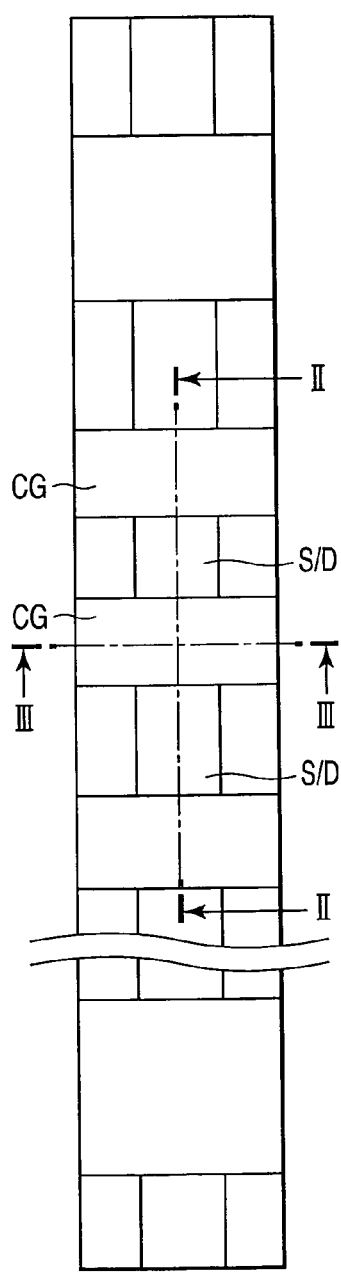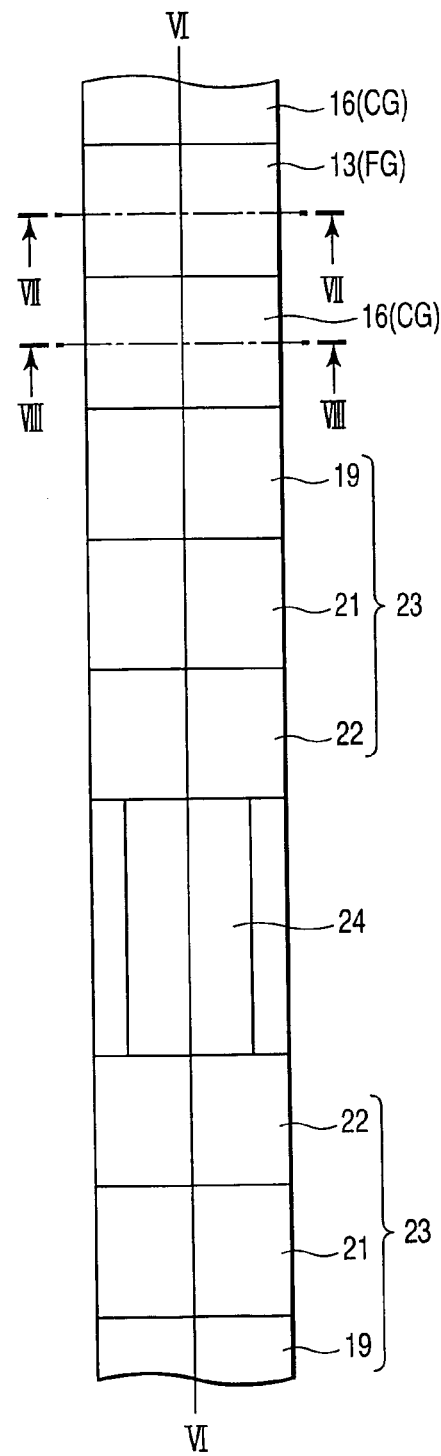
FIG. 1
(PRIOR ART)
FIG. 5

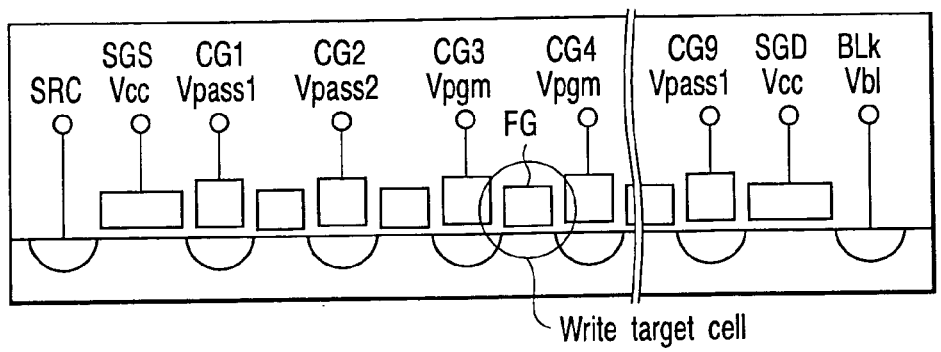
F I G. 2 0
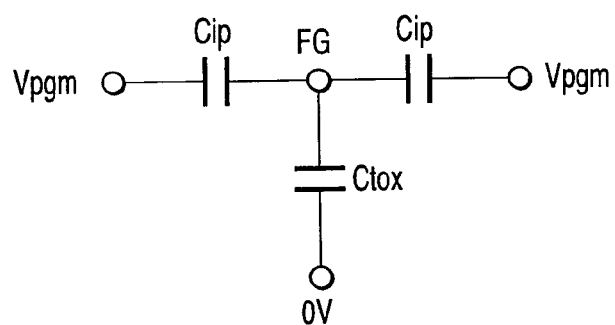
F I G. 2 1
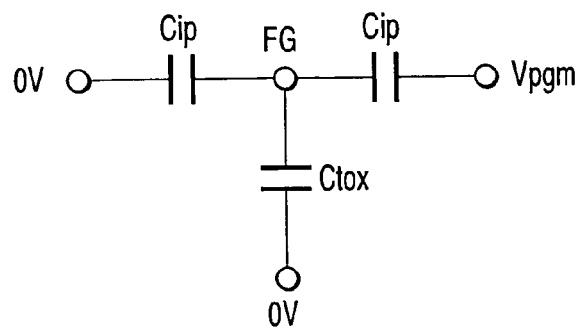
F I G. 2 2

NONVOLATILE SEMICONDUCTOR MEMORY DEVICE

CROSS-REFERENCE TO RELATED APPLICATIONS

This application is based upon and claims the benefit of priority from prior Japanese Patent Applications No. 2003-194396, filed Jul. 9, 2003; and No. 2004-189817, filed Jun. 28, 2004, the entire contents of both of which are incorporated herein by reference.

BACKGROUND OF THE INVENTION

1. Field of the Invention

This invention relates to a nonvolatile semiconductor memory device having a multilayer gate structure including a floating gate and a control gate.

2. Description of the Related Art

FIGS. 1 through 3 illustrates a known NAND type EEPROM realized by utilizing shallow trench isolation (STI). FIG. 1 is a schematic plan view and FIGS. 2 and 3 are two different cross-sectional views of FIG. 1.

As shown in FIG. 2, a gate insulation film GI, which is a tunneling insulation film, is formed on a silicon substrate (Si-sub) and floating gates FG are formed thereon. The floating gates FG of adjacent cells are separated and electrically insulated from each other. The structure that separates adjacently located floating gates FG apart from each other is referred to as a slit. The floating gates FG between a pair of slits are covered at the top and the opposite lateral sides by an inter-gate insulation film IGI. Each floating gate FG can be made to hold an electric charge for a long period because it is covered by a tunneling insulation film and an inter-gate insulation film.

A control gate CG is formed on the inter-gate insulation film. Normally, a control gate CG is shared by a large number of cell transistors and adapted to drive the number of cell transistors simultaneously. The control gate CG is also referred to as word line WL.

On the other hand, the cross-sectional view of FIG. 3 is taken along a bit line BL. Stacked gate structures illustrated in FIG. 3 are arranged on the substrate in rows along the direction of bit lines BL. Each cell transistor is processed in a self-aligning manner by means of resist or a processing mask layer. In the NAND type memory device where a number of cells are connected in series by way of select gates, adjacent cells share a source and a drain in order to reduce the area occupied by each cell. Each word line WL and the gap separating adjacent word lines WL are formed with minimum feature size by micro-processing.

Electrons are injected into a floating gate FG by applying a high write potential to the corresponding control gate CG and grounding the substrate. As cell transistors are micronized, an increased parasitic capacitance appears between adjacent cells and between a floating gate FG and a peripheral structure. For this reason, there is a tendency of raising the write voltage of cell transistors for the purpose of increasing the data writing rate. Control gates CG need to be reliably insulated from each other and word line drive circuits are required to withstand high voltages when a high voltage is used for the write voltage. This poses a problem when arranging memory elements at high density and driving them to operate at high speed.

It is possible to roughly estimate the potential required for write operation by seeing the structure shown in FIGS. 1 and 3. The control gate CG and the floating gate FG and the floating gate FG and the substrate can be regarded as capacitors where the gate insulation film and the tunneling insulation film are respectively sandwiched. In other words, as seen from the control gate CG, the memory cell is equivalent to a structure where two capacitors are connected in series.

FIG. 4 is an equivalent circuit diagram of a cell that is obtained when the capacitance of the capacitor between the control gate CG and the floating gate FG is Cip and the capacitance of the capacitor between the floating gate FG and the substrate is Ctox. The electric potential Vfg of the floating gate FG when a high write potential (Vpgm=Vcg) is applied to the control gate CG is defined by Cip and Ctox and can be roughly estimated by using the formula below:

$$Vfg = Cr \times (Vcg - Vt + Vt0),$$

where Cr=Cip/(Cip+Ctox) and Vt represents the threshold voltage of the cell transistor while Vt0 represents the threshold voltage (neutral threshold voltage) when the floating gate FG is totally free from electric charge.

The higher the electric potential Vfg of the floating gate FG, the stronger the electric field applied to the tunneling insulation film so injection of electrons into the floating gate FG can easily take place. It will be appreciated from the above formula that the value of Vfg can be raised by increasing the capacitance ratio (Cr) provided that Vcg is held to a constant level. In other words, it is necessary to make Cip have a large value relative to Ctox in order to reduce the write voltage.

The capacitance of a capacitor is proportional to the dielectric constant of the thin film arranged between the electrodes and the area of the opposed electrodes and inversely proportional to the distance between the opposed electrodes. A write/erase operation is obstructed when a leak current flows through the tunneling insulation film for allowing an electric charge to pass through for the purpose of the write/erase operation. Therefore, a technique of increasing the contact area of the gate insulation film and the floating gate FG and that of the gate insulation film and the control gate CG is normally used to increase the value of Cip. Techniques such as increasing the top surface of the floating gate FG by reducing the width of the slit (dimension 1a in FIG. 2) and increasing the length of the lateral walls of the floating gate FG (dimension 1b in FIG. 2) by increasing the film thickness of the floating gate FG have been developed to date.

However, when such a technique is used, the slit needs to be extremely micronized relative to the dimensions of the gate and the wiring materials and the difficulty of forming the gate increases as the floating gate FG is made thicker. Additionally, the parasitic capacitance between FG—FG increases as a result of micronization. In short, it obstructs micronization of cell transistors to maintain the capacitance ratio.

It is conceivable to reduce the write voltage by modifying the configuration of the floating gate FG and the control gate CG.

As a matter of fact, Japanese Laid-Open Patent (Kokai) No. 11-145429 describes a NAND type EEPROM that is designed to allow write/erase/read operations to be performed with a low voltage by increasing the capacitance between booster plates.

Japanese Laid-Open Patent (Kokai) No. 2002-217318 describes a nonvolatile memory device including micronized elements that are realized by raising the coupling ratio of the floating gate and the control gate and thereby reducing the write voltage.

Japanese Laid-Open Patent (Kokai) No. 2002-50703 describes a nonvolatile semiconductor memory device including MOSFETs that show improved write/erase/read characteristics and area realized by forming floating gate at opposite lateral sides of each control gate.

Furthermore, Y. Sasago et al. "10-MB/s Multi-Level Programming of Gb-Scale Flash Memory Enabled by New AG-AND Cell Technology" 2002 IEEE IEDM, pp. 952–954 describes an AG-AND memory cell where an assist gate is arranged adjacent to a floating gate.

However, it is still difficult to increase the capacitance between the control gate and the floating gate by means of the above described prior art. In other words, it is difficult to reduce the write voltage and realize a highly integrated memory that operates at high speed by means of the prior art. Therefore, nonvolatile semiconductor memory devices that can reduce the write voltage, has high capacity and realize a high speed operation.

Furthermore, in the prior art, a selection gate of a selection transistor for selecting a memory cell is constituted by electrically connecting a control gate to a floating gate positioned in an end portion.

When a memory cell transistor and the selection transistor are formed in a two-layer gate structure, for the micronizing of the memory cell, a height of a gate electrode needs to be increased in order to maintain a coupling capacitance equal to that before micronization. Therefore, in this structure, the height of the gate electrode of the selection transistor also increases, thus it becomes difficult to process the gate electrode.

Moreover, since the selection transistor requires superior cut-off characteristics as compared with the memory cell transistor, the selection transistor is formed in such a manner that a channel length is sufficiently large as compared with the memory cell transistor. Thereafter, by the forming of the selection transistor, periodicity of the memory cell largely collapses, and it becomes difficult to adjust the channel lengths of the memory cells positioned on opposite ends of a memory cell array. Furthermore, a problem occurs that a margin of lithography of the memory cell array drops.

BRIEF SUMMARY OF THE INVENTION

According to an aspect of the present invention, there is provided a nonvolatile semiconductor memory comprising: a memory cell including a floating gate constituted of a first conductive layer formed on a semiconductor substrate via a gate insulation film, a pair of first diffusion layers which are source or drain regions formed in the substrate positioned on opposite sides of the floating gate, first and second control gates constituted of second conductive layers formed on the opposite sides of the floating gate to drive the floating gate, and an inter-gate insulation film formed between the first and second control gates and the floating gate; and a selection transistor for selecting the memory cell, including a selection gate•wiring including a first portion constituted of the same conductive layer as the first conductive layer, disposed adjacent to one of the first and second control gates via the inter-gate insulation film, and formed on the substrate via the gate insulation film, and a second portion constituted of the same conductive layer as the second conductive layer, disposed adjacent to the first portion, electrically connected to the first portion, and formed on the substrate via an insulation film, and a second diffusion layer formed in the substrate, facing the second portion of the selection gate•wiring.

BRIEF DESCRIPTION OF THE SEVERAL VIEWS OF THE DRAWING

FIG. 1 is a plan view showing an example of a conventional nonvolatile semiconductor memory device;

FIG. 5 is a plan view showing a constitution of a cell array in the nonvolatile semiconductor memory device according to a first embodiment;

FIG. 20 is a diagram showing an example of a potential applied to each section in a case where the data is written together with a schematic section of the circuit of FIG. 19;

FIG. 21 is an equivalent circuit diagram showing an example of potential setting in a case where the data is written into the cell shown in FIG. 19;

FIG. 22 is an equivalent circuit diagram showing another example of the potential setting in a case where the data is written into the cell shown in FIG. 19;

DETAILED DESCRIPTION OF THE INVENTION

The present invention will be described herein-after in accordance with embodiments.

(First Embodiment)

Figure 2:
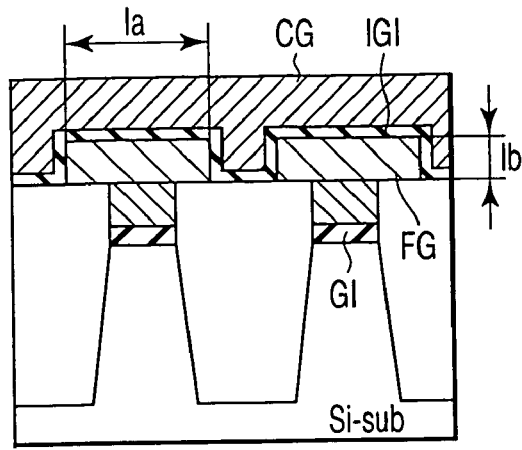
FIG. 2 is a cross-sectional view of FIG. 1.
Figure 3:
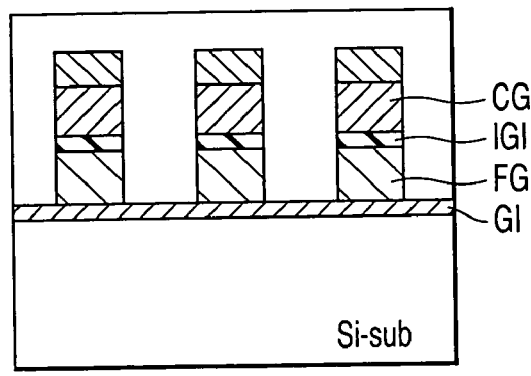
FIG. 3 is another cross-sectional view of FIG. 1.
Figure 4:
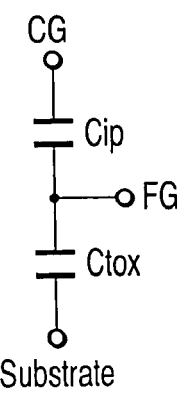
FIG. 4 is an equivalent circuit diagram of FIG. 1.
Figure 6:
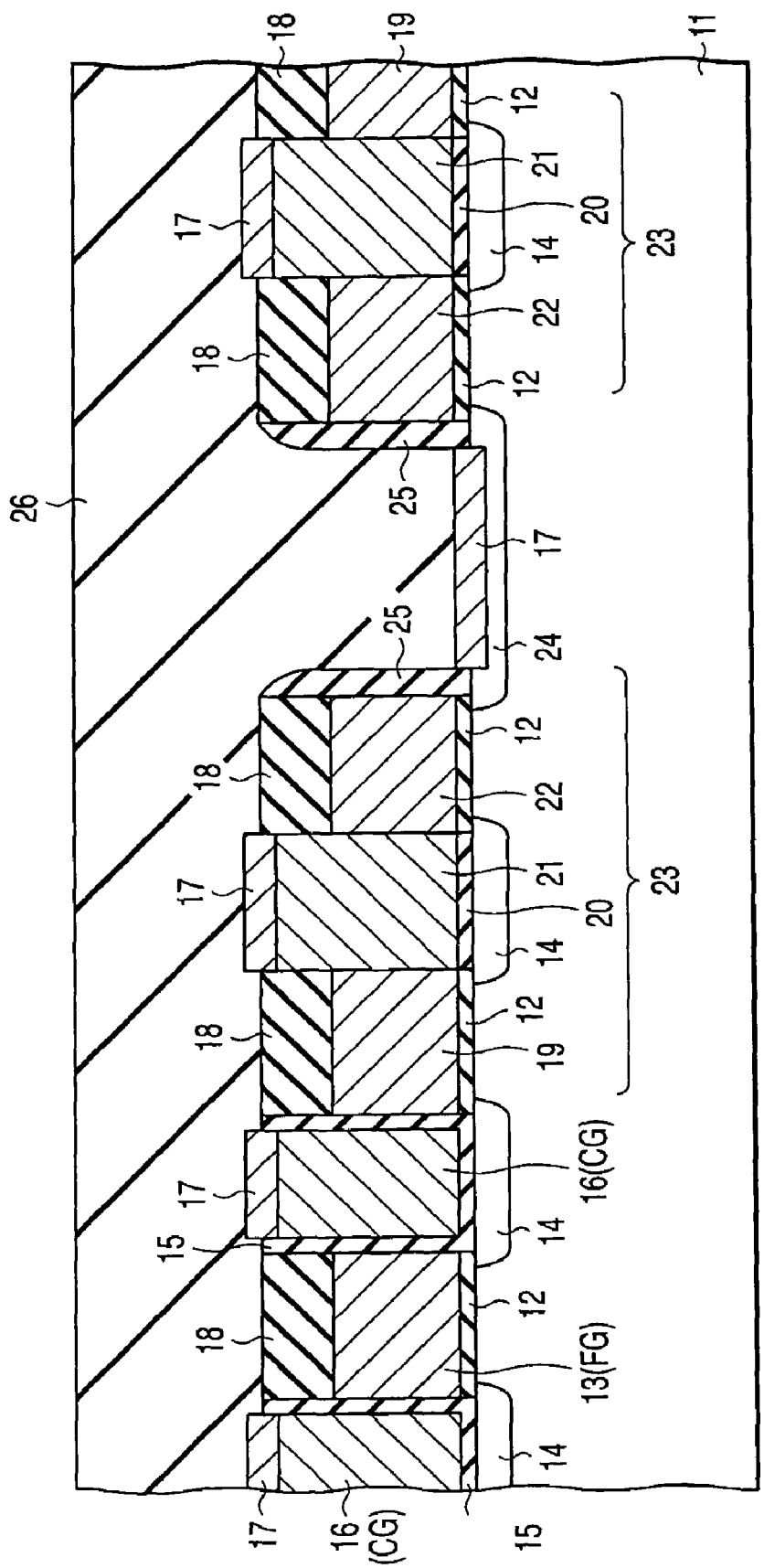
FIG. 6 is a cross-sectional view of FIG. 5.
Figure 7:
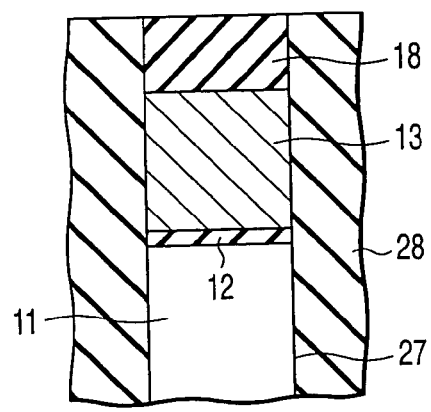
FIG. 7 is another cross-sectional view of FIG. 5.
Figure 8:
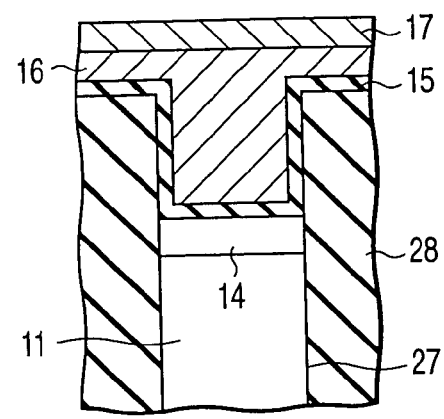
FIG. 8 is a still another cross-sectional view of FIG. 5.

FIGS. 5 to 8 show a constitution of a cell array in a nonvolatile semiconductor memory device according to a first embodiment. FIG. 5 is a plan view of the cell array, and FIGS. 6 to 8 are cross-sectional views showing different sections of FIG. 5.

A cell array according to a first embodiment comprises a plurality of memory cells connected in series to constitute a memory cell row, and a selection transistor for selecting the memory cell, connected to the memory cell row.

A memory cell comprises: a floating gate 13 (FG) formed on a silicon semiconductor substrate 11 via a gate insulation film 12; a pair of diffusion layers 14 which are source or drain regions positioned on opposite sides of the floating gate 13 and formed in the substrate 11; and first and second control gates (CG) 16 formed on the opposite sides of the floating gate 13 via inter-gate insulation films 15 are extended. It is to be noted that the first and second control gates (CG) 16 are shared between adjacent memory cells. The inter-gate insulation films 15 are formed to surround peripheries of the first and second control gates 16 except upper portions of the gates, that is, to extend to positions between the control gates and the diffusion layers 14. Furthermore, metal salicide layers 17 are formed on the first and second control gates 16. Mask layers 18 formed of insulation materials are formed on the floating gates 13.

A selection gate•wiring 23 are formed in the selection transistor for selecting the memory cell. The selection gate•wiring 23 comprise a first portion 19, a second portion 21, and a third portion 22 which are electrically connected to one another. The first portion 19 comprises the same conductive layer as that of the floating gate 13 and is disposed adjacent to one of the first and second control gates 16 via the inter-gate insulation film 15 and is formed on the substrate 11 via the gate insulation film 12. The second portion 21 comprises the same conductive layer as that of the control gate 16 and is disposed adjacent to the first portion 19 and is electrically connected to the first portion 19 and is formed on the substrate 11 on an insulation film 20. The third portion 22 comprises the same conductive layer as that of the control gate 16 and is disposed adjacent to the second portion 21 and is electrically connected to the second portion 21 and is formed on the substrate 11 via the gate insulation film 12.

Moreover, the mask layers 18 are formed on the first and third portions 19, 22 of the selection gate•wiring 23 in the same manner as in the floating gate 13, and the metal salicide layer 17 is formed on the second portion 21 of the selection gate•wiring 23. The diffusion layer 14 is formed in the substrate 11 facing the second portion 21. A diffusion layer 24 is formed in the silicon semiconductor substrate 11 on one of the opposite sides of the third portion 22, opposite to a side on which the diffusion layer 14 is formed. The diffusion layer 24 is connected to a common source line or bit line. The metal salicide layer 17 is also formed on the surface of the diffusion layer 24.

A spacer 25 comprising the insulation material is formed on a side wall of the third portion 22 of the selection gate•wiring 23. The spacer 25 may comprise a single layer of insulation film, or a plurality of layers of insulation films. Furthermore, an interlayer insulation film 26 is deposited on the whole surface of the substrate.

As shown in FIGS. 7 and 8, a shallow trench 27 for shallow trench isolation (STI) extended in parallel with an arrangement direction of the diffusion layers 14, 24 is formed in the substrate 11, and an insulation film 28 for isolating devices is buried in the trench 27 to isolate a plurality of memory cell rows from one another.

A floating gate has heretofore been driven by a control gate in the conventional cell. On the other hand, in the memory cell of the first embodiment, the floating gate 13 is driven by two control gates 16, 16 positioned on the opposite sides of the floating gate.

Moreover, the selection transistor comprises the selection gate•wiring 23, the diffusion layer 14 positioned under the second portion 21, the diffusion layer 24, a channel region between a pair of diffusion layers 14, and a channel region between the diffusion layers 14, 24. Here, the first portion 19 and the third portion 22 of the selection gate•wiring 23 work as the selection gate, and the second portion 21 is used as a wiring for connecting a plurality of selection gates to one another. That is, a driving voltage is applied to the second portion 21, the voltages are supplied to the first portion 19 and the third portion 22 positioned on the opposite sides of the second portion, accordingly an inversion channel is formed on the surface of the substrate 11 positioned under the first portion 19 and third portion 22, the diffusion layer 14 in a memory cell row end portion is electrically connected to the diffusion layer 24, and the memory cell row is selected.

Figure 9:
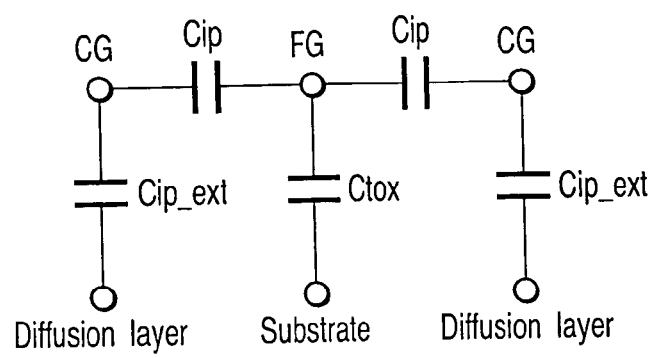
FIG. 9 is an equivalent circuit diagram of a cell of the first embodiment.

FIG. 9 shows an equivalent circuit of the cell of the first embodiment. Here, Cip represents a capacitance between two control gates CG and a floating gate FG, Cip_ext represents a capacitance between two control gates CG and a substrate, and Ctox represents a capacitance between the floating gate FG and the substrate. In this equivalent circuit, assuming that two control gates CG adjacent to the floating gate FG have an equal potential (Vcg), a capacitance ratio (Cr) which determines a potential Vfg of the floating gate is roughly estimated by the following equation:

$$Cr = Cip/(Cip + Ctox)$$
$$= (2 \times \varepsilon ip \times W \times Tfg/Tip)/((2 \times \varepsilon ip \times W \times Tfg/Tip) + \varepsilon tox \times W \times L/Ttox),$$

where $\varepsilon ip$ represents a permittivity of an inter-gate insulation film, $\varepsilon tox$ represents a permittivity of a gate insulation film, W represents a channel width of a cell transistor, L represents a gate length of the cell transistor, Tfg represents a film thickness of the floating gate FG, Ttox represents a film thickness of the gate insulation film, and Tip represents a film thickness of the inter-gate insulation film.

It is seen from the above equation that Cr can be increased by increasing the film thickness Tfg of the floating gate 13 without changing the channel width or the gate length of the transistor, which should be a minimum design dimension in the cell transistor of the present embodiment. This means that the capacitance ratio can be improved, even when the cell is micronized.

Moreover, as shown in FIG. 6, a space between the floating gates 13 is substantially completely filled with the control gate 16. Therefore, a coupling capacitance between the floating gates adjacent to each other in a word line WL direction, which has heretofore been a problem in the conventional cell, and two parasitic capacitances of a fringe capacitance between the substrate and the floating gate are substantially shielded.

From the above, in the cell of the first embodiment, the capacitance ratio can be secured by increasing the film thickness of the floating gate 13 without considering any increase of the parasitic capacitance. As a result, even when the gate length or the channel width of the cell transistor is micronized, the capacitance ratio can be increased. Additionally, since the capacitance ratio can be increased, a write voltage can be reduced. Therefore, according to the first embodiment, the micronizing of the cell and the reducing of the write voltage can be simultaneously satisfied.

Furthermore, since the selection gate•wiring 23 of the selection transistor do not have a conventional two-layer structure, and have a single-layer structure, the height of the gate electrode decreases, and the gate electrode can be easily processed.

Additionally, in the selection gate•wiring 23 of the selection transistor, the second portion 21 having substantially the same structure as that of the control gate 16 of the memory cell row in the middle, and the first and third portions 19, 22 having substantially the same structure as that of the floating gate 13 of the memory cell row are arranged in one row, and are connected to one another. That is, the selection transistor has a sufficiently large channel length as compared with the memory cell transistor, and therefore has superior cut-off characteristics as compared with the memory cell transistor.

Next, a method of manufacturing the nonvolatile semiconductor memory device according to the first embodiment will be described with reference to FIGS. 10A to 10H. It is to be noted that FIGS. 10A to 10A correspond to a cross-sectional view of FIG. 6.

Figure 10A:
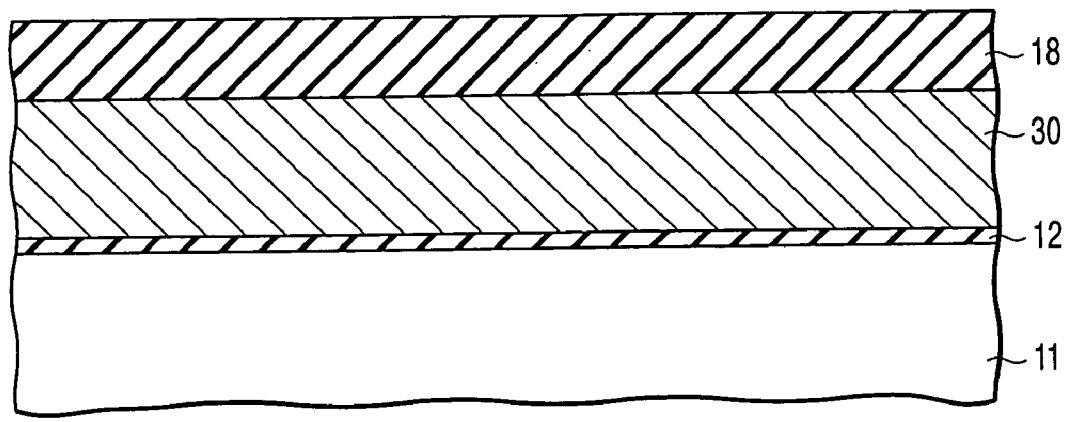
FIGS. 10A to 10H are cross-sectional views successively showing manufacturing steps of the nonvolatile semiconductor memory device according to the first embodiment.

First, as shown in FIG. 10A, the gate insulation film 12 is formed, for example, of any one of silicon oxide, silicon nitride, aluminum oxide, hafnium oxide, and zirconia oxide, or of a stacked film of at least two of them on the silicon semiconductor substrate 11. Conductive materials constituting the floating gates, such as a polysilicon layer 30 and a mask layer 18 are successively formed on the gate insulation film 12. For example, insulation materials such as a silicon oxide film and a silicon nitride film are used in the mask layer 18. The mask layer 18 has a minimum condition that a selectivity to the polysilicon layer 30 is obtained in etching the polysilicon layer 30. However, it is more preferable that a selectivity to the insulation film for the burying be obtained in a chemical mechanical polishing (CMP) step during the forming of STI described later and that a selectivity to the control gate be obtained in the CMP step during the forming of the control gate. Thereafter, the mask layer 18 is patterned by a lithography step and a selective etching step. The polysilicon layer 30, gate insulation film 12, and substrate 11 are successively etched using the patterned mask layer 18 to form the shallow trench 27 for isolating the devices as shown in FIGS. 7 and 8. Next, the insulation film 28 formed, for example, of a silicon oxide film is formed on the whole surface, for example, by chemical vapor deposition (CVD) to fill the trench 27 (shown in FIGS. 7 and 8) formed in the substrate 11. Subsequently, the insulation film 28 is polished down to the mask layer 18 by the CMP step using the mask layer 18 as a stopper, and the STI is formed.

Figure 10B:
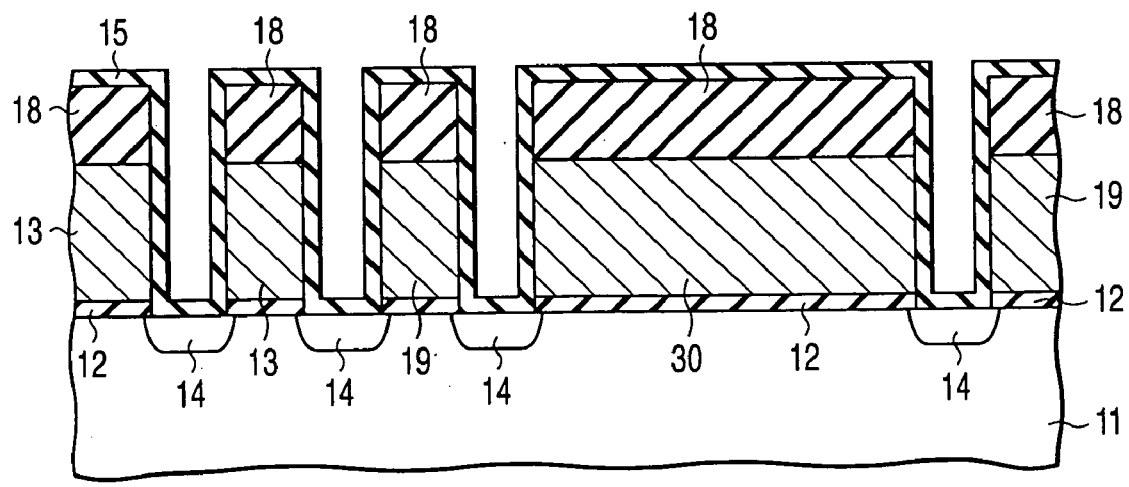

Subsequently, as shown in FIG. 10B, the lithography step and selective etching step are performed to etch the mask layer 18, polysilicon layer 30, and gate insulation film 12, and the floating gate is formed. As a result, in the memory cell array, the floating gate 13 of each memory cell is formed of the polysilicon layer 30. At this time, the first portion 19 of the selection gate•wiring 23 is formed by the polysilicon layer 30 in such a manner that the first portion is disposed adjacent to the floating gate 13 in an endmost portion of the memory cell row. Between the pair of first portions 19, the mask layer 18, polysilicon layer 30, and gate insulation film 12 are left for a space for forming the third portion 22 of the selection gate•wiring 23 and the and diffusion layer 24 shown in FIG. 6. Subsequently, an oxide film is formed on the whole surface, impurity ions are injected into the substrate 11, and the diffusion layers 14 are formed to constitute source/drain regions (S/D) of the cell transistors. Next, after the oxide film used in injecting the ions is removed, the inter-gate insulation film 15 is formed on the whole surface. The inter-gate insulation film 15 is formed, for example, by any one of silicon oxide, silicon nitride, aluminum oxide, hafnium oxide, and zirconia oxide, or a stacked film of at least two of them. As an example, a so-called ONO film of three layers including silicon oxide, silicon nitride, and silicon oxide may be used.

Figure 10C:
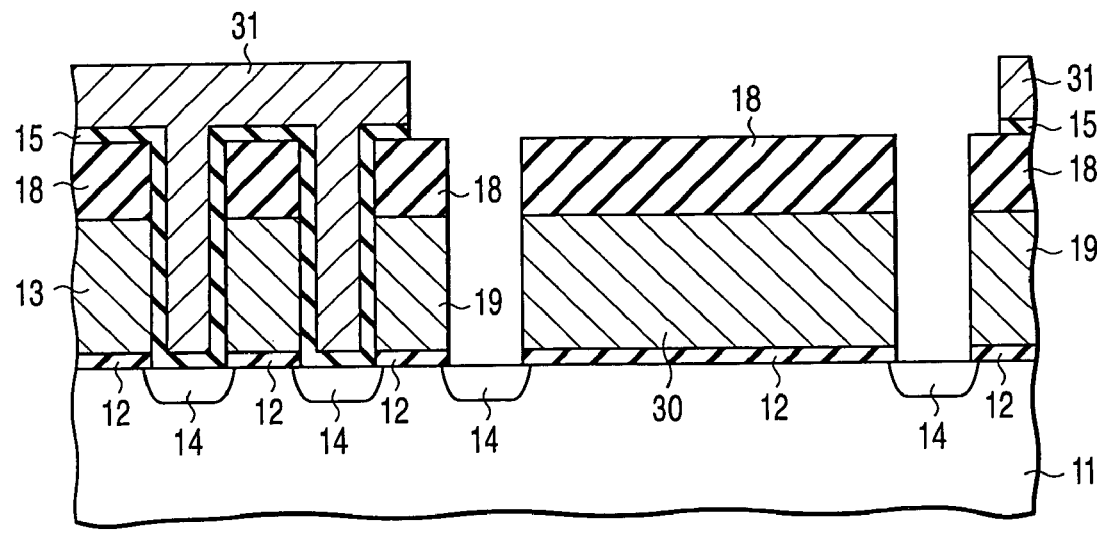

Subsequently, as shown in FIG. 10C, a mask layer 31 is formed having a pattern for continuously covering the memory cell row and a part of the first portion 19 of the selection gate•wiring 23, and the inter-gate insulation film 15 is removed in a masked state with the mask layer 31.

Figure 10D:
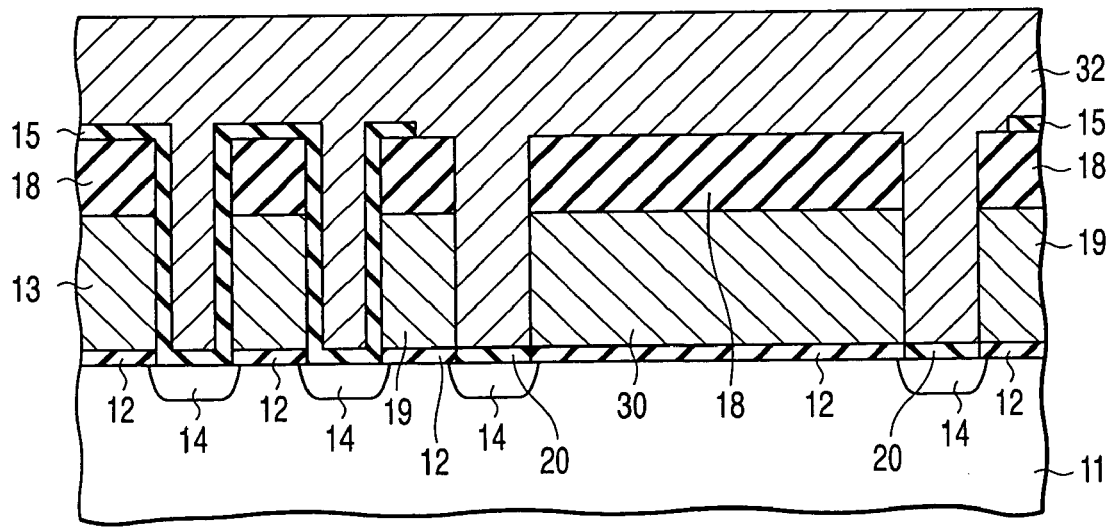
Figure 10:
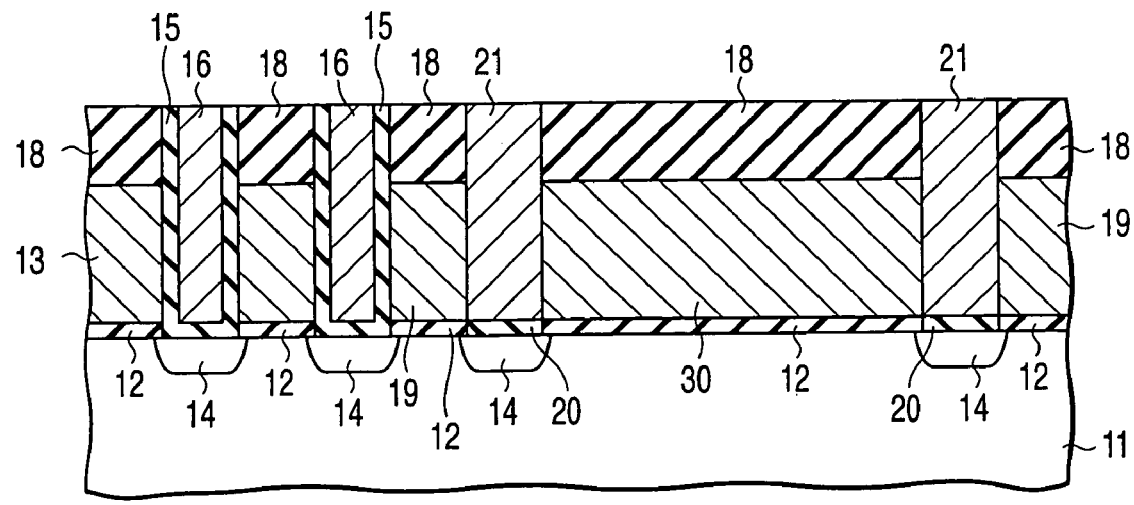
Figure 10:
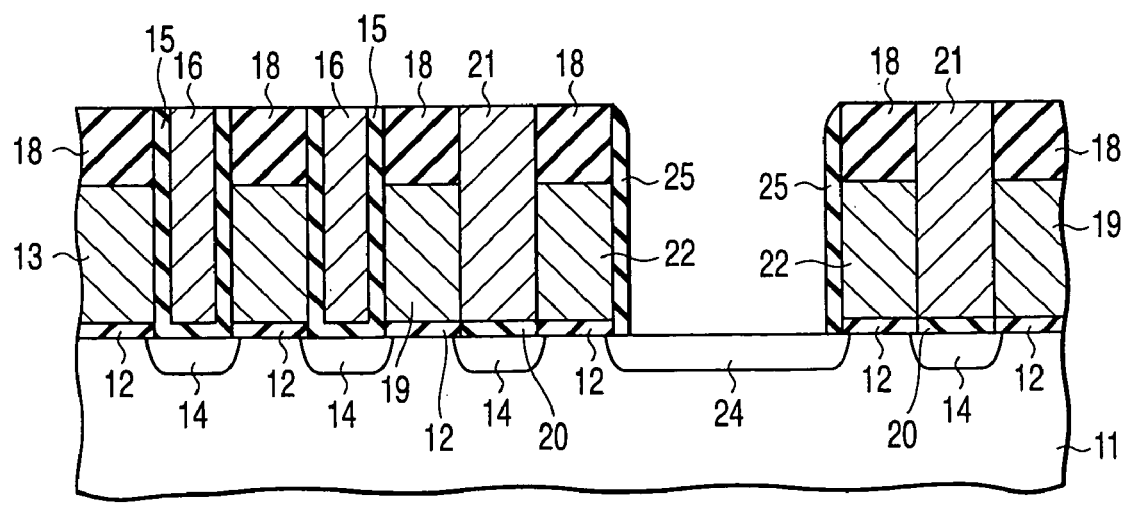

Thereafter, as shown in FIG. 10D, after removing the mask layer 31 and further forming the insulation film 20 on the exposed surface of the substrate, a conductive material forming the control gate and a part of the selection gate•wiring 23, such as a polysilicon layer 32, is formed by the CVD step.

Next, as shown in FIG. 10E, the polysilicon layer 32 is polished down to the mask layer 18 on the floating gate 13 by the CMP step, and flatted. At this time, the inter-gate insulation film 15 left on the mask layer 18 is also removed. Accordingly, in the memory cell row, the control gate 16 is formed of the polysilicon layer 32 between the floating gates 13, and the second portion 21 formed of the polysilicon layer 32 is disposed adjacent to the first portion 19 of the selection gate•wiring 23 in a region of the selection transistor.

Next, as shown in FIG. 10F, a resist layer is formed on the whole surface, the lithography step and the selective etching step are performed, and the mask layer 18, polysilicon layer 30 and lower gate insulation film 12 left in the region of the selection transistor are etched using the patterned resist layer as a mask. As a result, the third portion 22 is formed of the polysilicon layer 30 and disposed adjacent to the insulation film 20 of the selection gate•wiring 23 in the region of the selection transistor. Subsequently, after removing the resist layer from the whole surface, the insulation material for forming a spacer is deposited on the whole surface, thereafter the insulation material is etched by RIE, and the spacer 25 is formed on the side wall of the third portion 22. As described above, the spacer 25 may comprise a single insulation film, or a plurality of layers of insulation films. After forming the spacer 25 and forming the oxide film on the whole surface, the impurity ions are injected into the substrate 11 to form the diffusion layer 24 which is the source/drain (S/D) region of the selection transistor. Thereafter, the oxide film used in injecting the ions is removed.

Figure 10G:
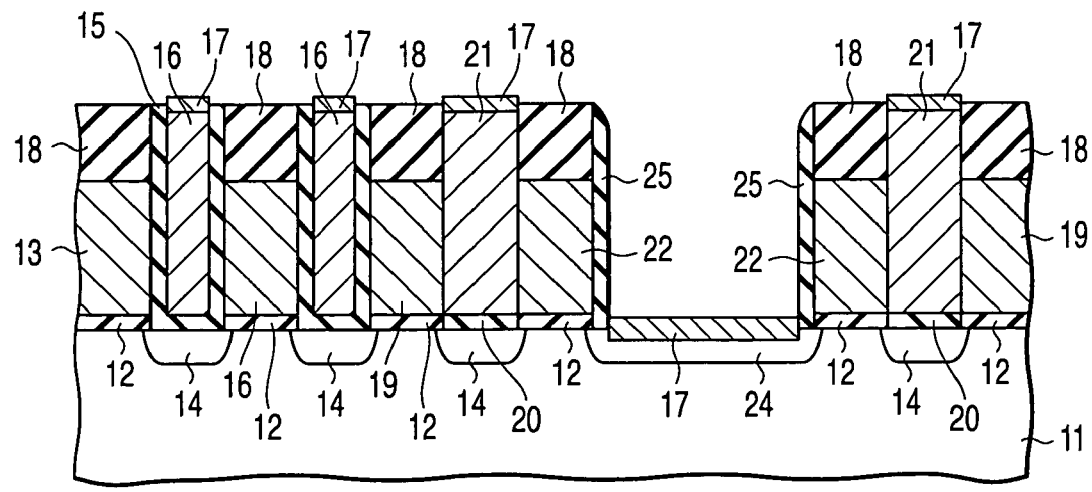

Next, as shown in FIG. 10G, a metal thin film is deposited on the whole surface, and thereafter heated, and the mask layer 18 is used as a control film for a salicide reaction. Accordingly, the metal salicide layer 17 is formed on the control gate 16, and the metal salicide layers 17 are formed on the second portion 21 of the selection gate•wiring 23 and on the surface of the diffusion layer 24. Non-reacted metal thin films are thereafter removed.

Figure 10H:
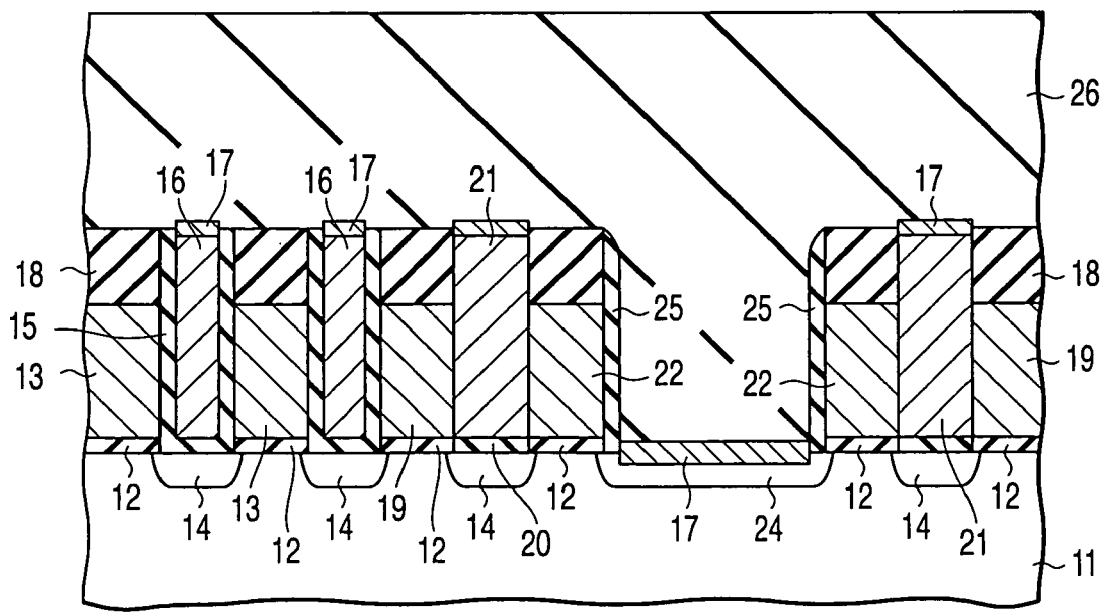

Thereafter, as shown in FIG. 10H, the interlayer insulation film 26 is formed on the whole surface, an opening connected to the surface of the diffusion layer 24 is further formed in the interlayer insulation film 26, and a contact plug is formed to fill in the opening.

It is to be noted that a case where the control gate 16 has a salicide structure has been described, but in the present embodiment, the control gate 16 is formed in a self-aligned manner with respect to the floating gate 13, and therefore a metal wiring may also be formed on the upper surface of the control gate 16. Furthermore, the control gate 16 itself may also be formed of a metal material. In this embodiment, the following materials are applicable to the control gate 16 and the second portion 21 of the selection gate•wiring 23.

Examples of a metal material applied to the salicide structure include titanium, cobalt, and nickel. When the control gate 16 and the second portion 21 of the selection gate•wiring 23 are formed of metal materials, for example, any one of titanium, tungsten, tungsten nitride, and titanium nitride or a stacked film of at least two of them is applicable.

In the present embodiment, the control gates 16 are formed on the opposite side surfaces of the floating gate 13 via the inter-gate insulation films 15. Therefore, capacitive coupling of the floating gate 13 and control gates 16 increases as compared with the prior art. The wiring of the control gate 16 needs to be a material having a sufficiently low resistance value, and the metal salicide layer 17 formed on the control gate is useful for lowering the wiring resistance value of the control gate 16.

Moreover, the selection gate•wiring 23 of the selection transistor are formed following an arranged state of the floating gate 13 and control gate 16 of the memory cell row as such. Therefore, when the selection transistor is formed, there is no possibility that periodicity of the memory cell collapses or that the channel lengths of the memory cells positioned on opposite ends of the memory cell row fluctuate. Accordingly, a problem that a margin of lithography of the memory cell row drops is solved.

(Second Embodiment)

Figure 11:
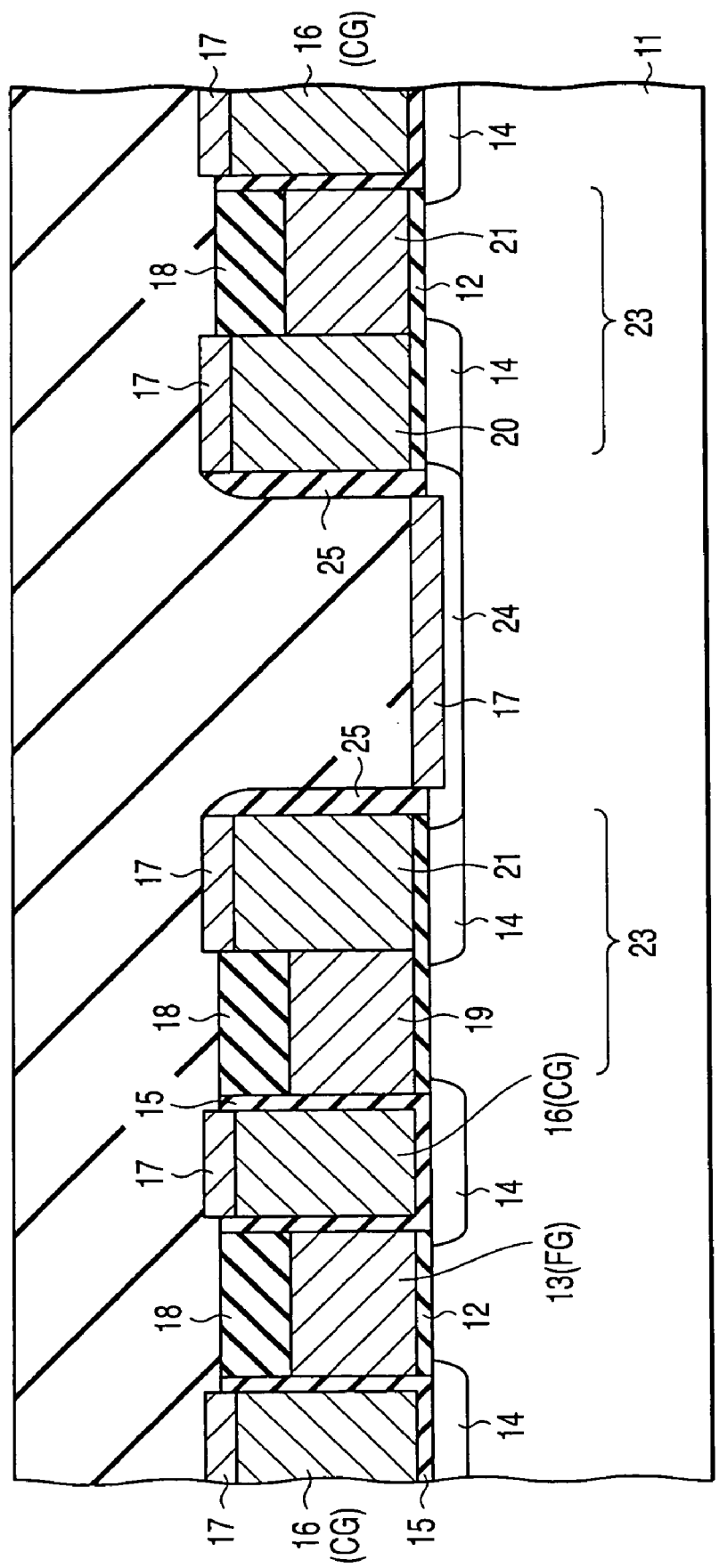
FIG. 11 is a cross-sectional view showing a constitution of a cell array in the nonvolatile semiconductor memory device according to a second embodiment.

FIG. 11 shows a constitution of a cell array in a nonvolatile semiconductor memory device according to a second embodiment, and corresponds to a cross-sectional view of FIG. 6 in the first embodiment. It is to be noted that in FIG. 11, portions corresponding to those of FIG. 6 are denoted with the same reference numerals, and the description is omitted.

In the cell array according to the first embodiment, a case where the selection gate•wiring 23 comprise three portions including the first, second, and third portions 19, 21, 22 has been described. On the other hand, in the second embodiment, the selection gate•wiring 23 comprises the first and second portions 19, 21, and the third portion 22 is omitted. In this constitution, the first portion 19 serves as the selection gate, and the second portion 21 serves as a wiring for supplying a driving voltage to the selection gate.

It is to be noted that in the second embodiment, the diffusion layer 14 formed in the substrate 11 under the second portion 21 is connected to the diffusion layer 24, and the spacer 25 is formed on the side wall of the second portion 21.

Even in the memory cell in the second embodiment, the floating gate 13 is driven by two control gates 16, 16 positioned on the opposite sides of the floating gate 13. Therefore, in the cell of the second embodiment, when the film thickness of the floating gate is increased without considering any increase of a parasitic capacitance, a capacitance ratio can be secured. As a result, even when the gate length or the channel width of the cell transistor is micronized, the capacitance ratio can be increased. Additionally, since the capacitance ratio can be increased, a write voltage can be reduced. Therefore, according to the second embodiment, the micronizing of the cell and the reducing of the write voltage can be simultaneously satisfied.

Furthermore, since the selection gate•wiring 23 of the selection transistor do not have a two-layer structure as in the prior art, and have a single-layer structure, the height of the gate electrode decreases, and the gate electrode can be easily processed.

Additionally, in the selection gate•wiring 23 of the selection transistor, the first portion 19 having substantially the same structure as that of the floating gate 13 of the memory cell row, and the second portion 21 having substantially the same structure as that of the control gate 16 are arranged in a row, and are connected to each other. That is, the selection transistor has a sufficiently large channel length as compared with the memory cell transistor, and therefore has superior cut-off characteristics as compared with the memory cell transistor.

The nonvolatile semiconductor memory device according to the second embodiment can be manufactured, when all the polysilicon layers 30 contacting the second portions 21 and the mask layers 18 on the polysilicon layers are removed in the step of FIG. 10F during the manufacturing of the nonvolatile semiconductor memory device according to the first embodiment, and thereafter steps similar to those of the first embodiment are performed.

(Third Embodiment)

Figure 12:
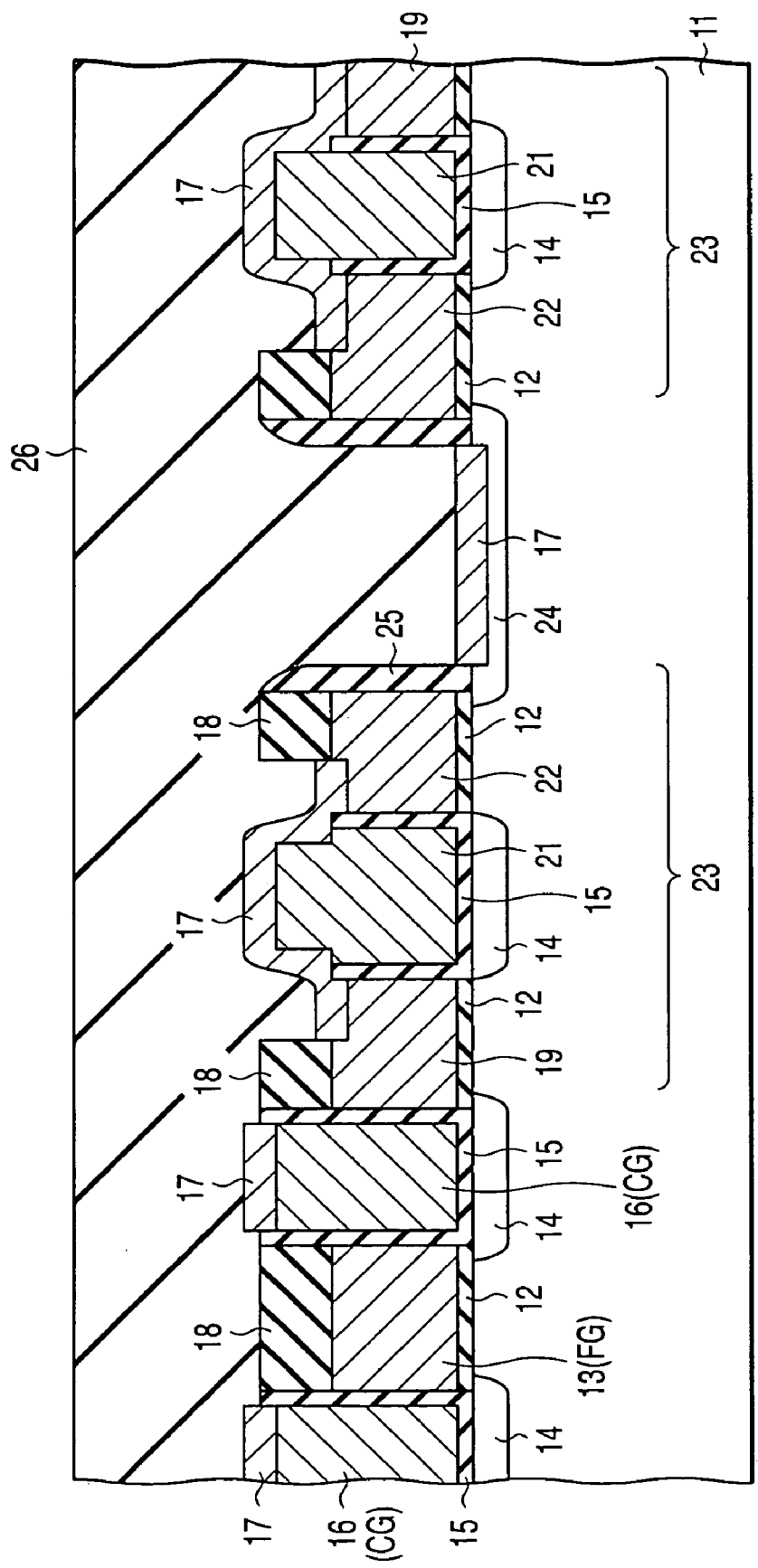
FIG. 12 is a cross-sectional view showing a constitution of the cell array in the nonvolatile semiconductor memory device according to a third embodiment.

FIG. 12 shows a constitution of a cell array in a nonvolatile semiconductor memory device according to a third embodiment, and corresponds to a cross-sectional view of FIG. 6 in the first embodiment. It is to be noted that in FIG. 12, portions corresponding to those of FIG. 6 are denoted with the same reference numerals, and the description is omitted.

In the cell array according to the first embodiment, direct contact of the first, second, and third portions 19, 21, 22 constituting the selection gate•wiring 23 have been described. On the other hand, in the third embodiment, the inter-gate insulation film 15 is left in the periphery of the second portion 21 to surround the second portion, and the second portion 21 does not directly contact the first and third portions 19, 22.

Then, in the third embodiment, a part of the upper portion of the inter-gate insulation film 15 formed around the second portion 21 is removed together with a part of the mask layer 18 which contacts the inter-gate insulation film. In the surface accordingly exposed, to form the metal salicide layer 17 on the second portion 21, the metal salicide layer 17 is formed to simultaneously connect the first, second, and third portions 19, 21, 22 to one another via the metal salicide layer 17.

That is, the selection gate•wiring 23 include the first portion 19, the second portion 21, the third portion 22, and the metal salicide layer 17 which is a conductive film for electrically connecting these first, second, and third portions 19, 21, 22 to one another. The first portion 19 comprises the same conductive layer as that of the control gate 16 and is disposed adjacent to the control gate 16 and is formed on the substrate 11 via the gate insulation film 12. The second portion 21 comprises the same conductive layer as that of the control gate 16, and contacts the first portion 19 via the inter-gate insulation film 15. The third portion 22 comprises the same conductive layer as that of the control gate 16 and contacts the second portion 21 via the inter-gate insulation film 15 and is formed on the substrate 11 via the gate insulation film 12. The metal salicide layer 17 is formed to continuously coat a part of the upper portion of the first portion 19, upper side surfaces and upper portion of the second portion 21, and a part of the upper portion of the third portion 22.

Even in the memory cell in the third embodiment, the floating gate 13 is driven by two control gates 16, 16 positioned on the opposite sides of the floating gate 13. Therefore, in the cell of the third embodiment, when the film thickness of the floating gate is increased without considering any increase of the parasitic capacitance, a capacitance ratio can be secured. As a result, even when the gate length or the channel width of the cell transistor is micronized, the capacitance ratio can be increased. Additionally, since the capacitance ratio can be increased, a write voltage can be reduced. Therefore, according to the third embodiment, the micronizing of the cell and the reducing of the write voltage can be simultaneously satisfied.

Furthermore, since the selection gate•wiring 23 of the selection transistor do not have a two-layer structure as in the prior art, and have a single-layer structure, the height of the gate electrode decreases, and the gate electrode can be easily processed.

Additionally, in the selection gate•wiring 23 of the selection transistor, the second portion 21 having substantially the same structure as that of the control gate 16 in the middle, and the first, third portions 19, 22 having substantially the same structure as that of the floating gate 13 of the memory cell row are arranged in a row, and are connected to one another. That is, the selection transistor has a sufficiently large channel length as compared with the memory cell transistor, and therefore has superior cut-off characteristics as compared with the memory cell transistor.

Next, a method of manufacturing the nonvolatile semiconductor memory device according to the third embodiment will be described with reference to FIGS. 13A to 13H. It is to be noted that FIGS. 13A to 13A correspond to a cross-sectional view of FIG. 6.

Figure 13A:
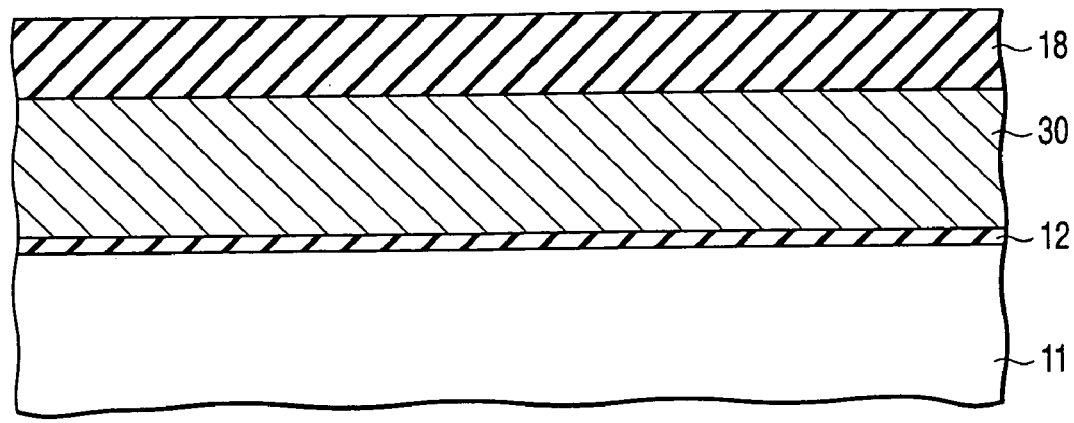
FIGS. 13A to 13H are cross-sectional views successively showing the manufacturing steps of the nonvolatile semiconductor memory device according to the third embodiment.

First, as shown in FIG. 13A, the gate insulation film 12 is formed, for example, of silicon oxide on the silicon semiconductor substrate 11. For example, a polysilicon layer 30 and a mask layer 18 are successively formed on the gate insulation film 12. For example, insulation materials such as a silicon oxide film and a silicon nitride film are used in the mask layer 18. Thereafter, the mask layer 18 is patterned by a lithography step and a selective etching step. The polysilicon layer 30, gate insulation film 12, and substrate 11 are successively etched using the patterned mask layer 18 to form the shallow trench 27 for isolating the devices as shown in FIGS. 7 and 8. Next, the insulation film 28 (shown in FIGS. 7 and 8) formed, for example, of a silicon oxide film is formed on the whole surface, for example, by CVD to fill the trench 27 formed in the substrate 11. Subsequently, the insulation film 28 is polished down to the mask layer 18 by the CMP step using the mask layer 18 as a stopper, and the STI is formed.

Figure 13B:
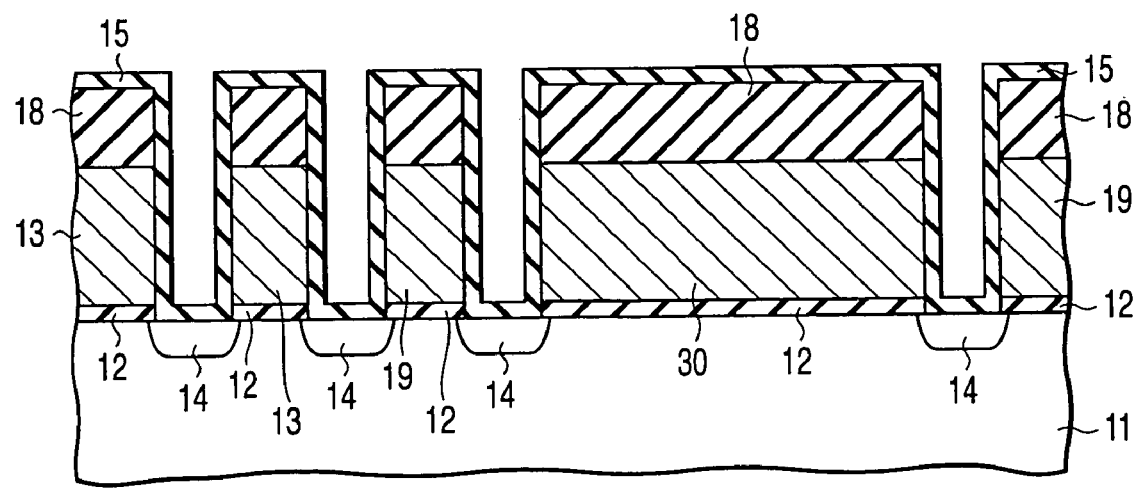

Subsequently, as shown in FIG. 13B, the lithography step and selective etching step are performed to etch the mask layer 18, polysilicon layer 30, and gate insulation film 12, and the floating gate is formed. As a result, in the memory cell row, the floating gate 13 of each memory cell is formed of the polysilicon layer 30. At this time, the first portion 19 of the selection gate•wiring 23 is formed by the polysilicon layer 30 in such a manner that the portion is disposed adjacent to the floating gate 13 in an endmost portion of the memory cell row. Between the pair of first portions 19, the mask layer 18, polysilicon layer 30, and gate insulation film 12 are left for a space for forming the third portion 22 of the selection gate•wiring 23 and the diffusion layer 24 shown in FIG. 12. Subsequently, an oxide film is formed on the whole surface, impurity ions are injected into the substrate 11, and the diffusion layers 14 are formed to constitute source/drain regions (S/D) of the cell transistors. Next, after the oxide film used in injecting the ions is removed, the inter-gate insulation film 15 is formed on the whole surface. The inter-gate insulation film 15 is formed, for example, by any one of silicon oxide, silicon nitride, aluminum oxide, hafnium oxide, and zirconia oxide, or a stacked film of at least two of them. As an example, a so-called ONO film of three layers including silicon oxide, silicon nitride, and silicon oxide may be used.

Figure 13C:
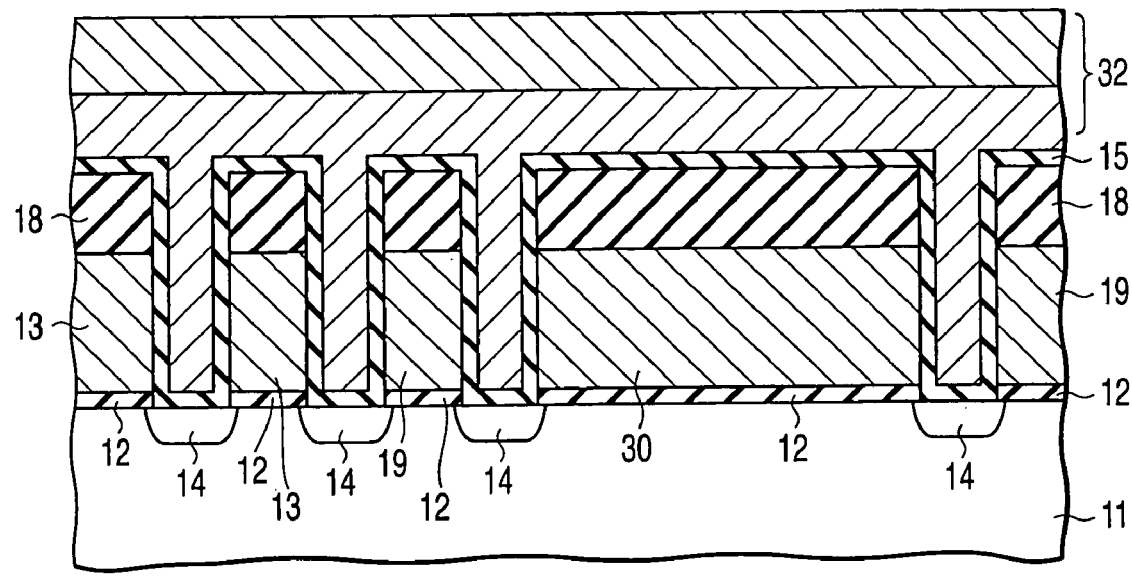

Subsequently, as shown in FIG. 13C, for example, a polysilicon layer 32 constituting the control gate and a part of the selection gate•wiring is formed on the whole surface by CVD.

Figure 13D:
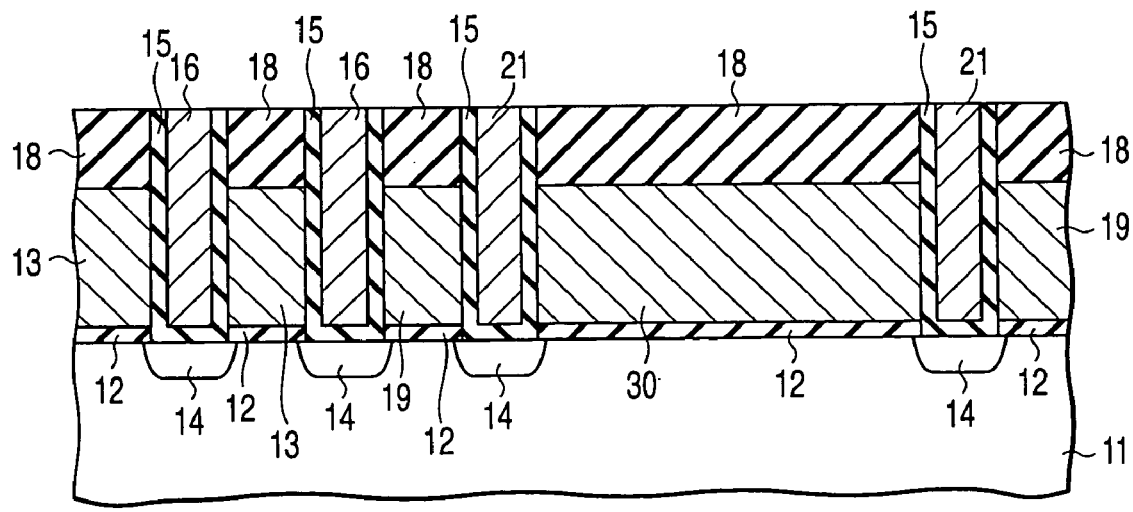

Subsequently, as shown in FIG. 13D, the polysilicon layer 32 is polished down to the mask layer 18 on the floating gate 13 by the CMP step, and flatted. Subsequently, the inter-gate insulation film 15 left on the mask layer 18 is removed. Accordingly, in the memory cell row, the control gate 16 is formed of the polysilicon layer 32 between the floating gates 13, and the second portion 21 formed of the polysilicon layer 32 is formed and disposed adjacent to the first portion 19 of the selection gate•wiring 23 in a region of the selection transistor.

Figure 13E:
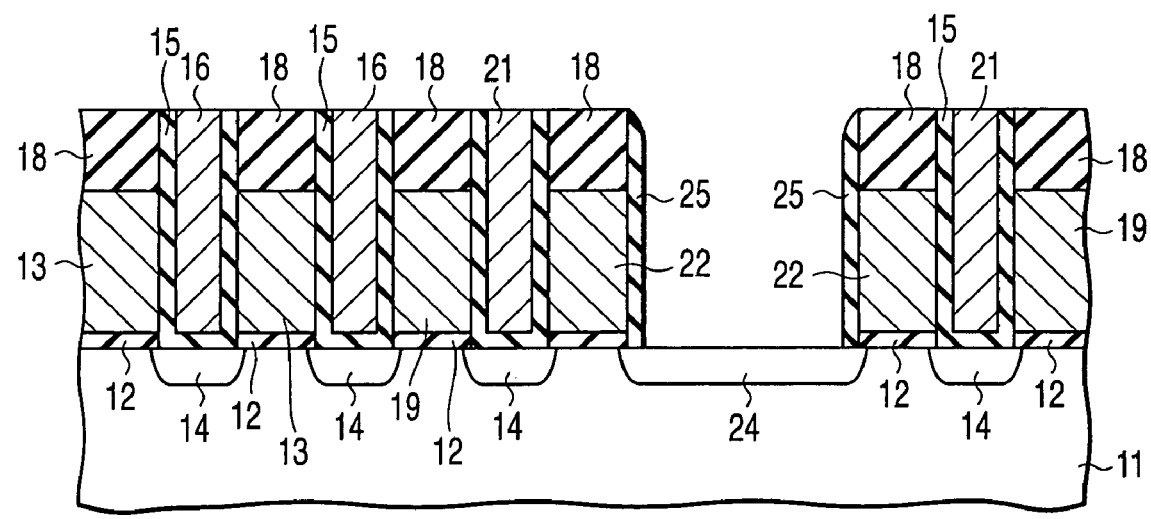

Next, as shown in FIG. 13E, a resist layer is formed on the whole surface, the lithography step and the selective etching step are performed, and the mask layer 18, polysilicon layer 30 and lower gate insulation film 12 left in the region of the selection transistor are etched using the patterned resist layer as a mask. As a result, the third portion 22 is formed of the polysilicon layer 30 and disposed adjacent to the insulation film 20 of the selection gate•wiring 23 in the region of the selection transistor. Subsequently, after removing the resist layer, the insulation material for forming a spacer is deposited on the whole surface, thereafter the insulation material is etched by RIE, and the spacer 25 is formed on the side wall of the third portion 22. After forming the spacer 25 and forming the oxide film on the whole surface, the impurity ions are injected into the substrate 11 to form the diffusion layer 24 which is the source/drain (S/D) region of the selection transistor. Thereafter, the oxide film used in injecting the ions is removed.

Figure 13F:
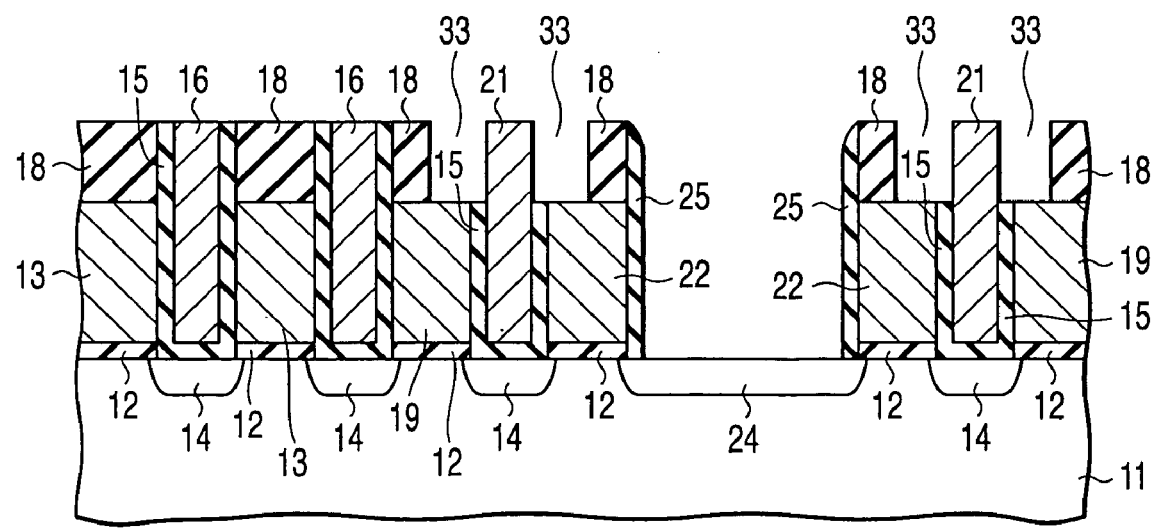

Next, as shown in FIG. 13F, a mask layer is formed, and the etching is performed using the mask layer. Accordingly, a part of the upper portion of the inter-gate insulation film 15 formed around the second portion 21 of the selection gate•wiring 23 is removed together with a part of the mask layer 18 which contacts the inter-gate insulation film, and openings 33 are formed.

Figure 13G:
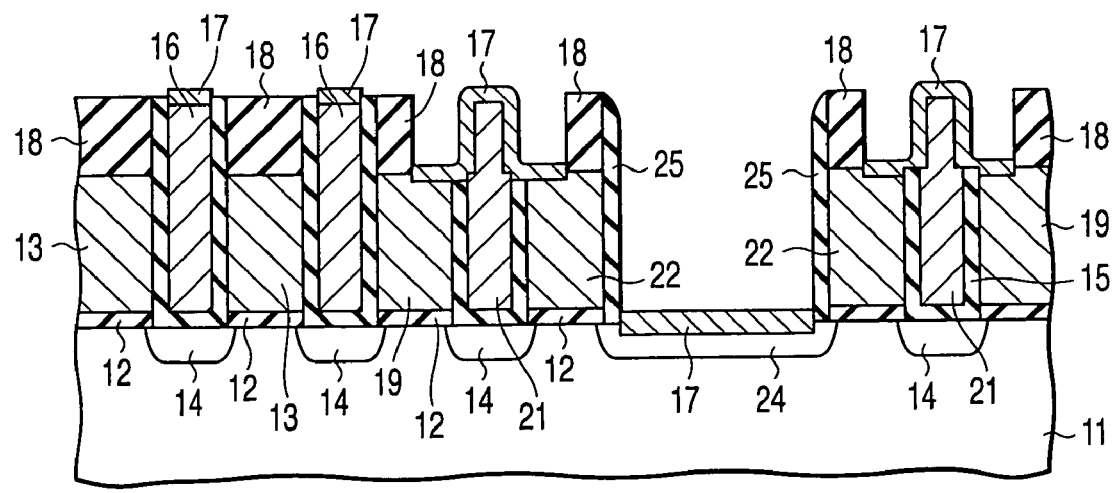

Next, as shown in FIG. 13G, a metal thin film is deposited on the whole surface, and thereafter heated, and the mask layer 18 is used as a control film for a salicide reaction. Accordingly, the metal salicide layer 17 is formed on the control gate 16, and the metal salicide layers 17 are formed on the second portion 21 of the selection gate•wiring 23 and on the surface of the diffusion layer 24. At this time, the metal salicide layer 17 is formed to simultaneously coat a part of the upper portion of the first portion 19, upper side surfaces and upper portion of the second portion 21, and a part of the upper portion of the third portion 22 continuously. Non-reacted metal thin films are thereafter removed.

Figure 13H:
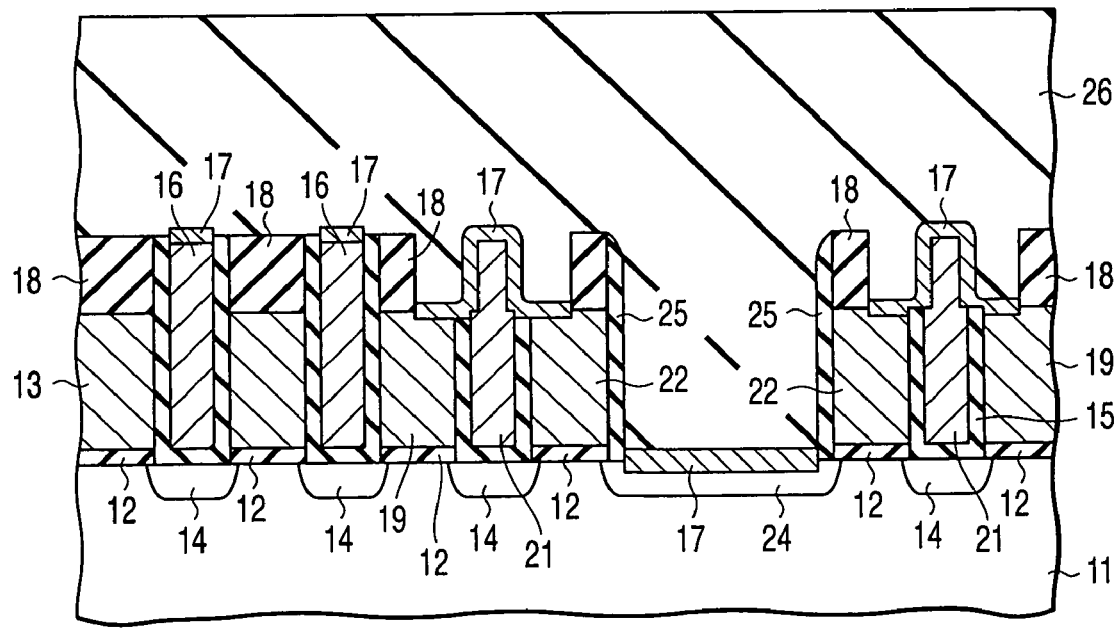

Next, as shown in FIG. 13H, the interlayer insulation film 26 is formed on the whole surface, an opening connected to the surface of the diffusion layer 24 is further formed in the interlayer insulation film 26, and a contact plug is formed to fill in the opening.

In the present embodiment, the control gates 16 are formed on the opposite side surfaces of the floating gate 13 via the inter-gate insulation films 15. Therefore, capacitive coupling of the floating gate 13 and control gates 16 increases as compared with the prior art. The wiring of the control gate 16 needs to be a material having a sufficiently low resistance value, and the metal salicide layer 17 formed on the control gate is useful for lowering the wiring resistance value of the control gate 16.

Moreover, the selection gate•wiring 23 of the selection transistor are formed following an arranged state of the floating gate 13 and control gate 16 of the memory cell row as such. Therefore, when the selection transistor is formed, there is no possibility that periodicity of the memory cell collapses or that the channel lengths of the memory cells positioned on opposite ends of the memory cell row fluctuate. Accordingly, a problem that a margin of lithography of the memory cell row drops is solved.

It is to be noted that after the step of FIG. 13G, a metal for wiring is formed on the whole surface, and patterned to form the wiring on the metal salicide layer 17 of the selection gate•wiring 23, so that wiring resistance can be reduced.

(Fourth Embodiment)

Figure 14:
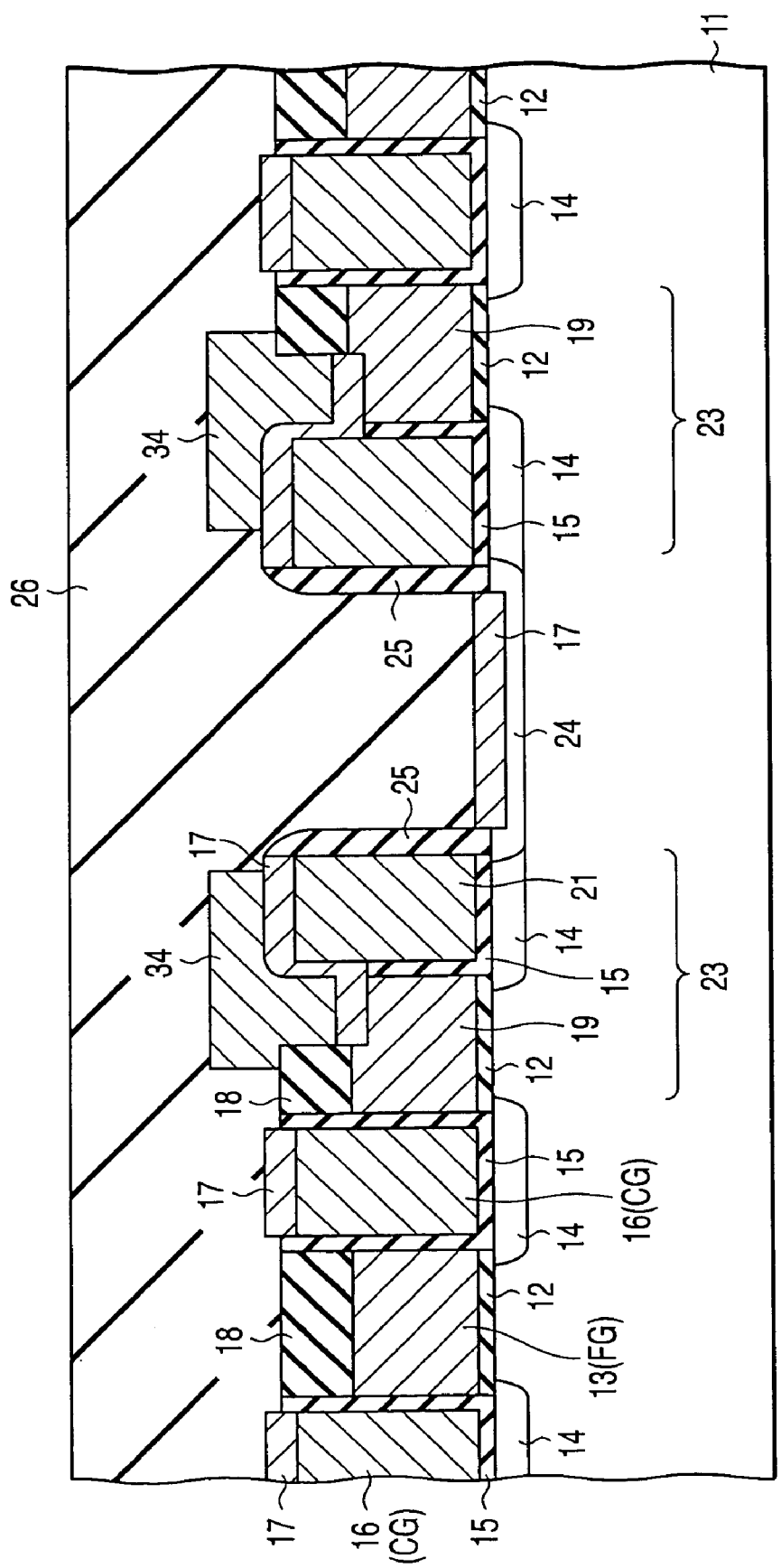
FIG. 14 is a cross-sectional view showing a constitution of the cell array in the nonvolatile semiconductor memory device according to a fourth embodiment.

FIG. 14 shows a constitution of a cell array in a nonvolatile semiconductor memory device according to a fourth embodiment, and corresponds to a cross-sectional view of FIG. 12 in the third embodiment. It is to be noted that in FIG. 14, portions corresponding to those of FIG. 12 are denoted with the same reference numerals, and the description is omitted.

In the cell array according to the third embodiment, a case where the selection gate•wiring 23 comprise the first, second, and third portions 19, 21, 22 and the metal salicide layer 17 for connecting the portions to one another has been described. On the other hand, in the fourth embodiment, the selection gate•wiring 23 comprise the first and second portions 19, 21 and the metal salicide layer 17 for connecting the portions to each other, and the third portion 22 is omitted.

In this constitution, the first portion 19 serves as the selection gate, and the second portion 21 serves as a wiring for supplying a driving voltage to the selection gate.

It is to be noted that in the fourth embodiment, the diffusion layer 14 formed in the substrate 11 under the second portion 21 is connected to the diffusion layer 24, and the spacer 25 is formed on the side wall of the second portion 21. In the present embodiment, a case where wirings 34 are formed on the metal salicide layers 17 in the first and second portions 19, 21 of the selection gate•wiring 23 will be described.

Even in the memory cell in the fourth embodiment, the floating gate 13 is driven by two control gates 16, 16 positioned on the opposite sides of the floating gate 13. Therefore, in the cell of the fourth embodiment, when the film thickness of the floating gate is increased without considering any increase of a parasitic capacitance, a capacitance ratio can be secured. As a result, even when the gate length or the channel width of the cell transistor is micronized, the capacitance ratio can be increased. Additionally, since the capacitance ratio can be increased, a write voltage can be reduced. Therefore, according to the fourth embodiment, the micronizing of the cell and the reducing of the write voltage can be simultaneously satisfied.

Furthermore, since the selection gate•wiring 23 of the selection transistor do not have a two-layer structure as in the prior art, and have a single-layer structure, the height of the gate electrode decreases, and the gate electrode can be easily processed.

Additionally, in the selection gate•wiring 23 of the selection transistor, the first portion 19 having substantially the same structure as that of the floating gate 13 of the memory cell row, and the second portion 21 having substantially the same structure as that of the control gate 16 are arranged in a row, and are connected to each other. That is, the selection transistor has a sufficiently large channel length as compared with the memory cell transistor, and therefore has superior cut-off characteristics as compared with the memory cell transistor.

The nonvolatile semiconductor memory device according to the fourth embodiment can be manufactured, when all the polysilicon layers 30 contacting the second portions 21 and the mask layers 18 on the polysilicon layers are removed in the step of FIG. 13E during the manufacturing of the nonvolatile semiconductor memory device according to the third embodiment, and thereafter steps similar to those of the third embodiment are performed.

(Fifth Embodiment)

Figure 15:
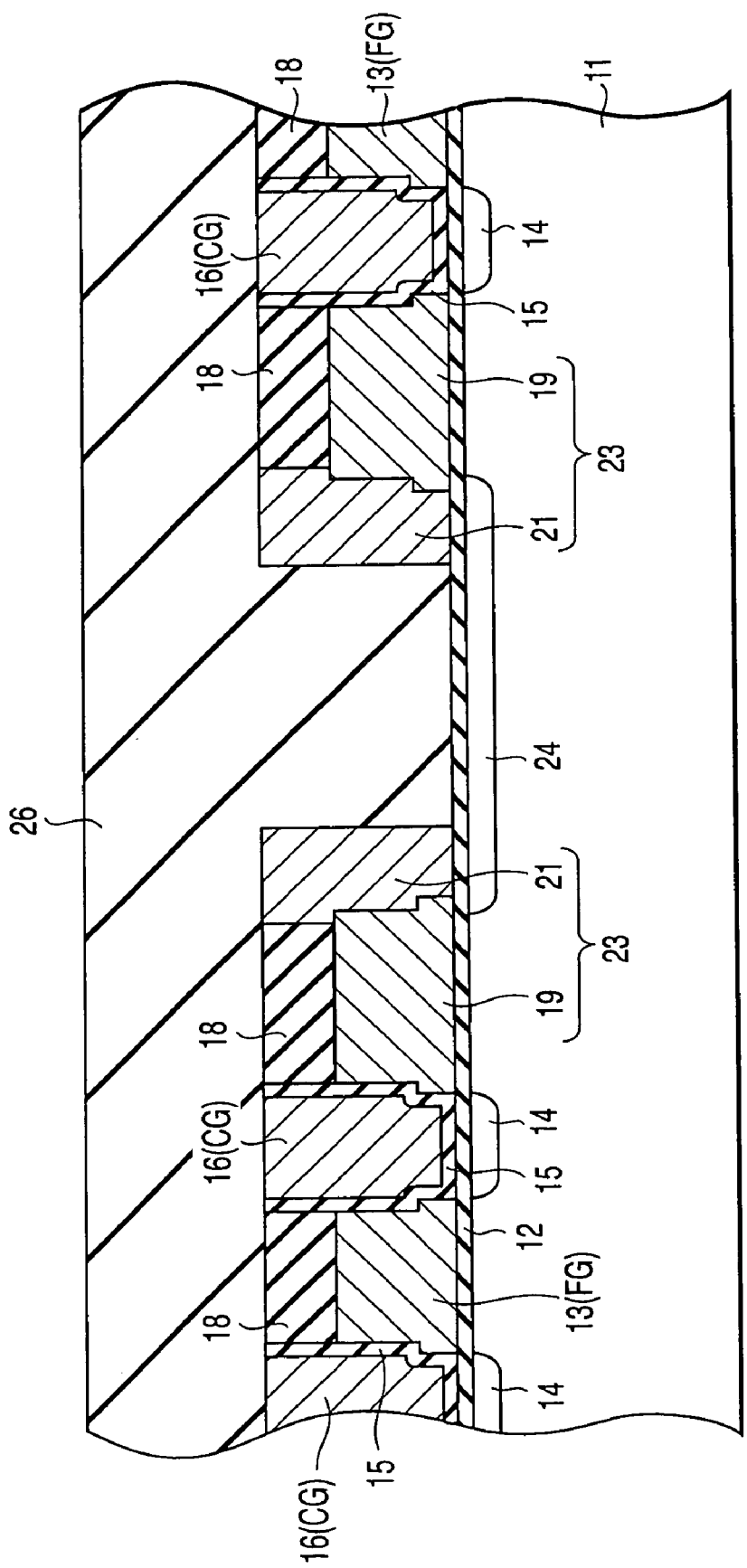
FIG. 15 is a cross-sectional view showing a constitution of the cell array in the nonvolatile semiconductor memory device according to a fifth embodiment.

FIG. 15 shows a constitution of a cell array in a nonvolatile semiconductor memory device according to a fifth embodiment, and corresponds to a cross-sectional view of FIG. 6 in the first embodiment.

A memory cell comprises: a floating gate 13 (FG) formed on a silicon semiconductor substrate 11 via a gate insulation film 12; diffusion layers 14 which are source or drain regions formed in the substrate 11 positioned on opposite sides of the floating gate 13; and first and second control gates (CG) 16 formed on the opposite sides of the floating gate 13 via an inter-gate insulation film 15. It is to be noted that the first and second control gates (CG) 16 are shared between adjacent two memory cells. A sectional shape of each floating gate 13 is formed in such a manner that a lower part of the section is broader than an upper part, and the inter-gate insulation film 15 is formed along the side surface of each floating gate 13.

The inter-gate insulation films 15 are formed to surround peripheries of the first and second control gates 16 except upper surfaces of the gates, that is, to extend to positions between the control gates and the diffusion layers 14. In this case, unlike the first embodiment, metal salicide layers 17 are not formed on the first and second control gates 16. Mask layers 18 formed of insulation materials are formed on the floating gates 13.

The selection transistor includes a first portion 19 which is formed of the same conductive layer as that of the floating gate 13 and which is disposed adjacent to one of the first and second control gates 16 via the inter-gate insulation film 15 and which is formed on the substrate 11 via the gate insulation film 12. The first portion 19 is formed in such a manner that a lower part of a sectional shape is broader than an upper part in the same manner as in the floating gate 13, and the inter-gate insulation film 15 is formed along the side surface of the first portion 19 adjacent to the control gate 16. The selection transistor includes a second portion 21 which is formed of the same conductive layer as that of the control gate 16 and which is disposed adjacent to the first portion 19 and which is electrically connected to the first portion 19 in a part where no mask layer 18 is formed, and which is formed on the substrate 11 via the gate insulation film 12. Moreover, the first portion 19 and the second portion 21 constitute the selection gate•wiring 23 of the selection transistor.

A mask layer 18 is formed on the first portion 19 of the selection gate•wiring 23 in the same manner as in the floating gate 13. In this case, unlike the first embodiment, the metal salicide layer 17 is not formed on the second portion 21 of the selection gate•wiring 23, but may be formed if necessary. A diffusion layer 24 is extended and formed in the substrate 11 facing the second portion 21. The diffusion layer 24 is integrated with the selection transistor, connected to the adjacent memory cell row. The diffusion layer 24 is connected to a common source line or a bit line. Furthermore, the interlayer insulation film 26 is deposited on the whole surface of the substrate.

In the conventional cell, a floating gate has heretofore been driven by a control gate. On the other hand, even in the memory cell of the fifth embodiment, the floating gate 13 is driven by two control gates 16, 16 positioned on the opposite sides of the floating gate.

Moreover, the selection transistor comprises the selection gate•wiring 23, the diffusion layer 24 positioned under the second portion 21, the diffusion layer 14, and a channel region between the diffusion layers 14, 24. Here, the first portion 19 of the selection gate•wiring 23 serves as the selection gate, and the second portion 21 is used as a wiring for connecting a plurality of selection gates to one another. That is, a driving voltage is applied to the second portion 21, the voltage is also supplied to the first portion 19, accordingly a inversion channel is formed on the surface of the substrate 11 positioned under the first portion 19, the diffusion layer 14 in a memory cell row end portion is electrically connected to the diffusion layer 24, and the memory cell row is selected.

Moreover, as shown in FIG. 15, a space between the floating gates 13 is substantially completely filled with the control gate 16. Therefore, a coupling capacitance between the floating gates adjacent to each other in a word line WL direction, which has heretofore been a problem in the conventional cell, and two parasitic capacitances of a fringe capacitance between the substrate and the floating gate are substantially shielded.

From the above, in the cell of the fifth embodiment, the capacitance ratio can be secured, when the film thickness of the floating gate is increased without considering any increase of the parasitic capacitance. As a result, even when the gate length or the channel width of the cell transistor is micronized, the capacitance ratio can be increased. Additionally, since the capacitance ratio can be increased, a write voltage can be reduced. Therefore, even in the fifth embodiment, the micronizing of the cell and the reducing of the write voltage can be simultaneously satisfied.

Furthermore, since the selection gate•wiring 23 of the selection transistor do not have a two-layer structure as in the prior art, and have a single-layer structure, the height of the gate electrode decreases, and the gate electrode can be easily processed.

Next, a method of manufacturing the nonvolatile semiconductor memory according to the fifth embodiment will be described with reference to FIGS. 16A to 16G.

Figure 16A:
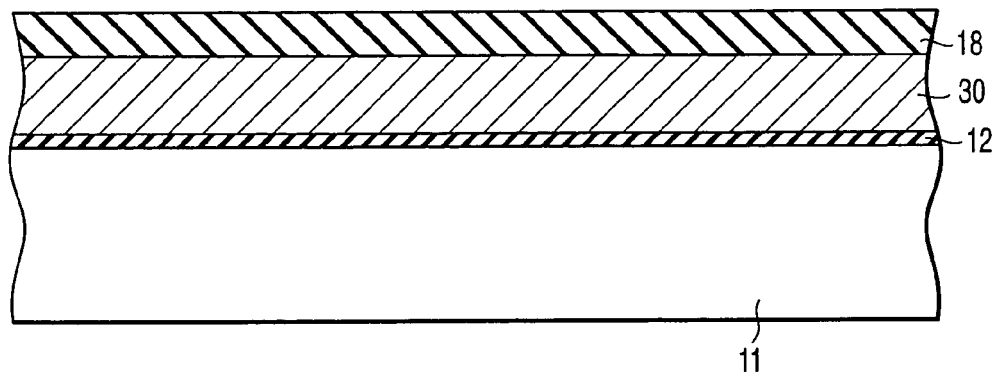
FIGS. 16A to 16G are cross-sectional views successively showing the manufacturing steps of the nonvolatile semiconductor memory device according to the fifth embodiment.

First, as shown in FIG. 16A, the gate insulation film 12 is formed, for example, of silicon oxide on the silicon semiconductor substrate 11. Conductive materials, such as a polysilicon layer 30 and a mask layer 18 are successively formed on the gate insulation film 12. For example, insulation materials such as a silicon oxide film and a silicon nitride film are used in the mask layer 18. Thereafter, the mask layer 18 is patterned by a lithography step and a selective etching step. The polysilicon layer 30, gate insulation film 12, and substrate 11 are successively etched using the patterned mask layer 18 to form the shallow trench 27 for isolating the devices as shown in FIGS. 7 and 8. Next, the insulation film 28 formed, for example, of a silicon oxide film is formed on the whole surface to fill the trench 27 formed in the substrate 11. Subsequently, the insulation film 28 is polished down to the mask layer 18 by the CMP step using the mask layer 18 as a stopper, and the STI is formed.

Figure 16B:
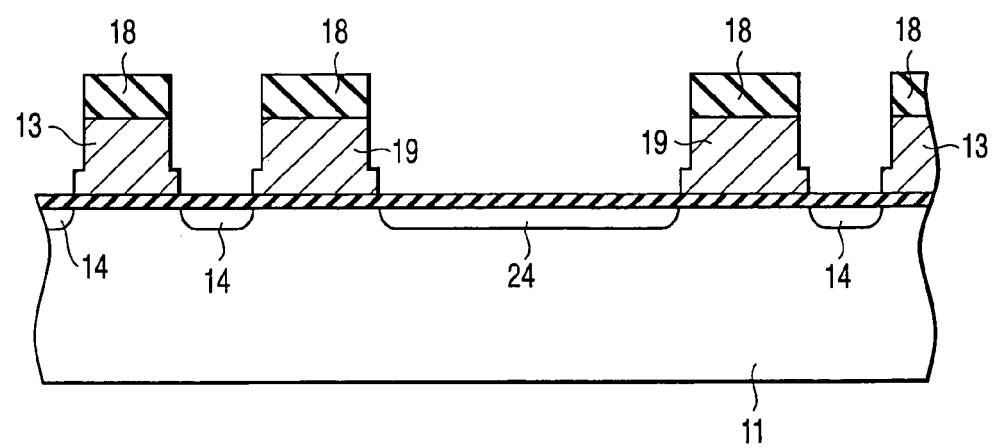

Subsequently, as shown in FIG. 16B, the lithography step and selective etching step are performed to etch the mask layer 18, and polysilicon layer 30, and the floating gate is processed. In this case, when the etching of the polysilicon layer 30 is discontinued halfway, as described above, the floating gate 13 and the first portion 19 of the selection gate•wiring 23 are formed in such a manner that the lower part of each sectional shape is broader than the upper part. Subsequently, impurity ions are injected into the substrate 11, the diffusion layers 14 constituting source/drain (S/D) regions of the cell transistors are formed, and the diffusion layer 24 constituting the source/drain (S/D) region of the selection transistor is formed.

Figure 16C:
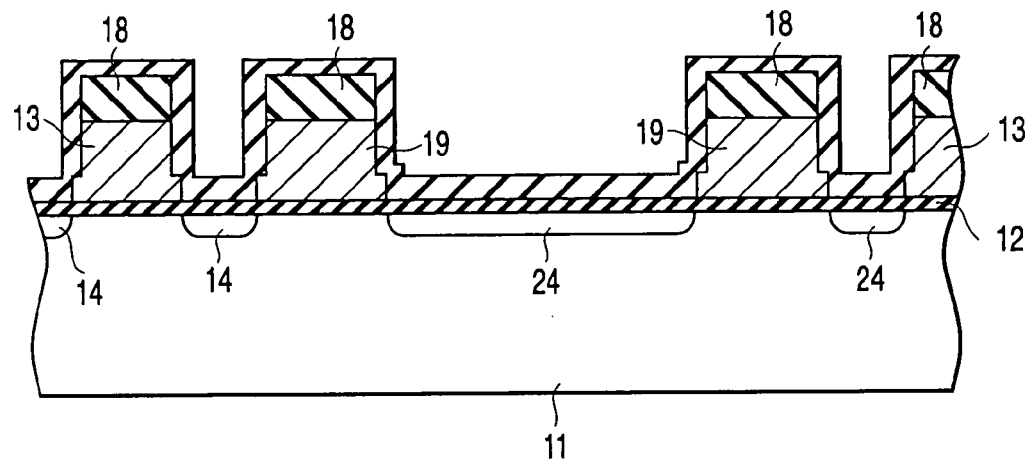

Next, as shown in FIG. 16C, the inter-gate insulation film 15 is formed on the whole surface. The inter-gate insulation film 15 is formed of, for example, one of silicon oxide, silicon nitride, aluminum oxide, hafnium oxide, and zirconia oxide, or a stacked film of at least two of them. As an example, a so-called ONO film of three layers including silicon oxide, silicon nitride, and silicon oxide may be used.

Figure 16D:
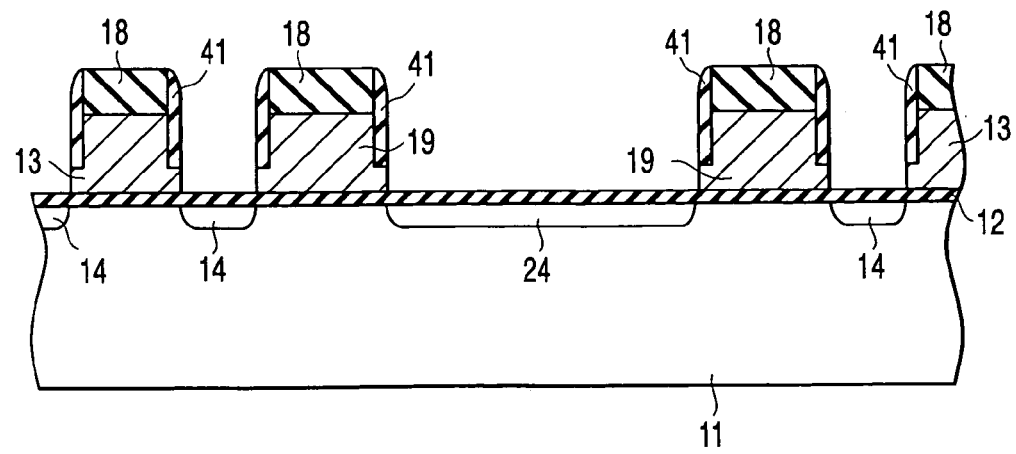

Subsequently, as shown in FIG. 16D, the inter-gate insulation films 15 on the diffusion layer 24 and on a part of the first portion 19 of the selection gate•wiring 23 adjacent to the diffusion layer are removed.

Figure 16E:
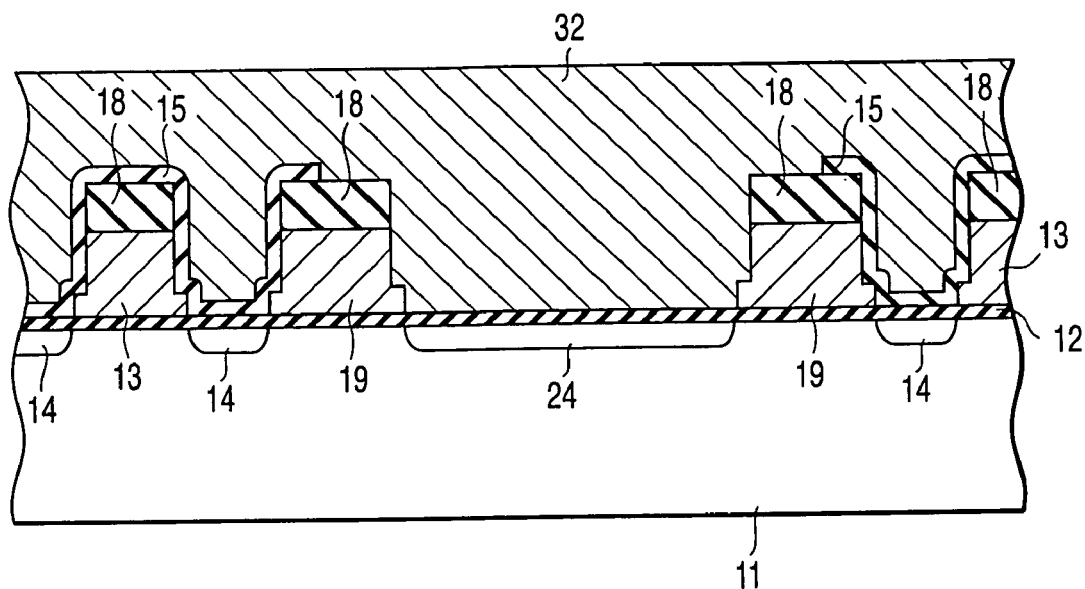

Thereafter, as shown in FIG. 16E, a conductive material forming the control gate and a part of the selection gate•wiring 23, such as a polysilicon layer 32, is formed by CVD.

Figure 16F:
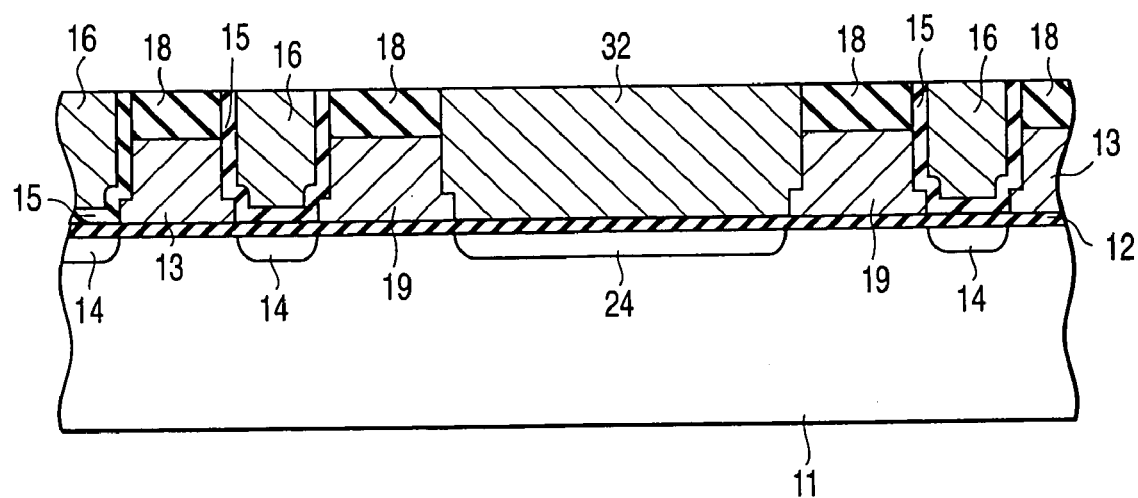

Subsequently, as shown in FIG. 16F, the polysilicon layer 32 is polished down to the mask layer 18 on the floating gate 13 by a CMP step, and flatted. At this time, the inter-gate insulation film 15 left on the mask layer 18 is also removed. Accordingly, in the memory cell row, the control gate 16 is formed of the polysilicon layer 32 between the floating gates 13. At this time, the polysilicon layer 32 is left on the diffusion layer 24.

Figure 16G:
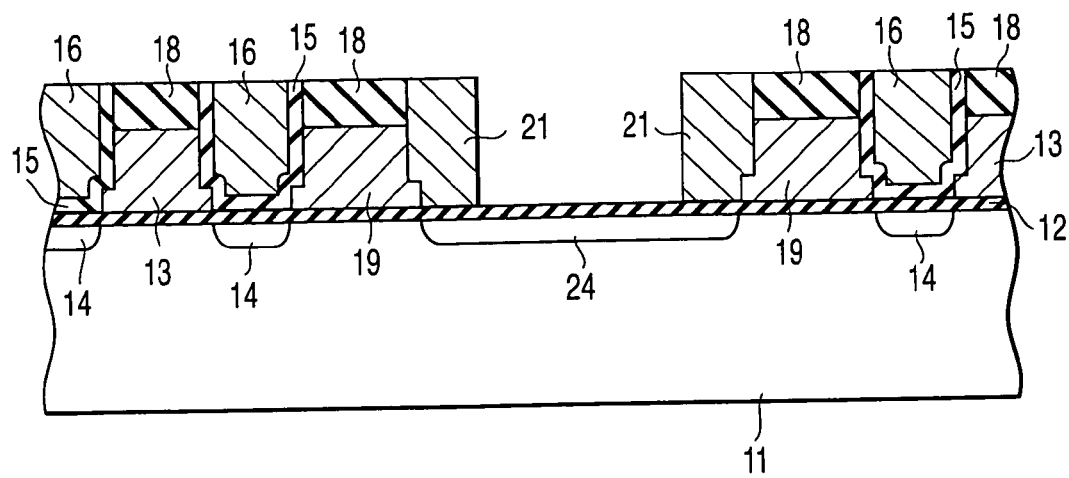

Next, a resist layer is deposited on the whole surface, the lithography step and the selective etching step are performed, and the polysilicon layer 32 remaining in a region for the selection transistor is etched using the patterned resist layer as a mask as shown in FIG. 16G. As a result, the second portion 21 is formed of the polysilicon layer 32 in such a manner that the portion is disposed adjacent to the first portion 19 of the selection gate•wiring 23 in the region of the selection transistor. Subsequently, the resist layer is removed, the interlayer insulation film 26 is deposited on the whole surface as shown in FIG. 15, an opening connected to the surface of the diffusion layer 24 is formed in the interlayer insulation film 26, and a contact plug is formed to fill in the opening.

Next, an operation of the nonvolatile semiconductor memory device according to the first to fifth embodiments will be described.

Figure 17:
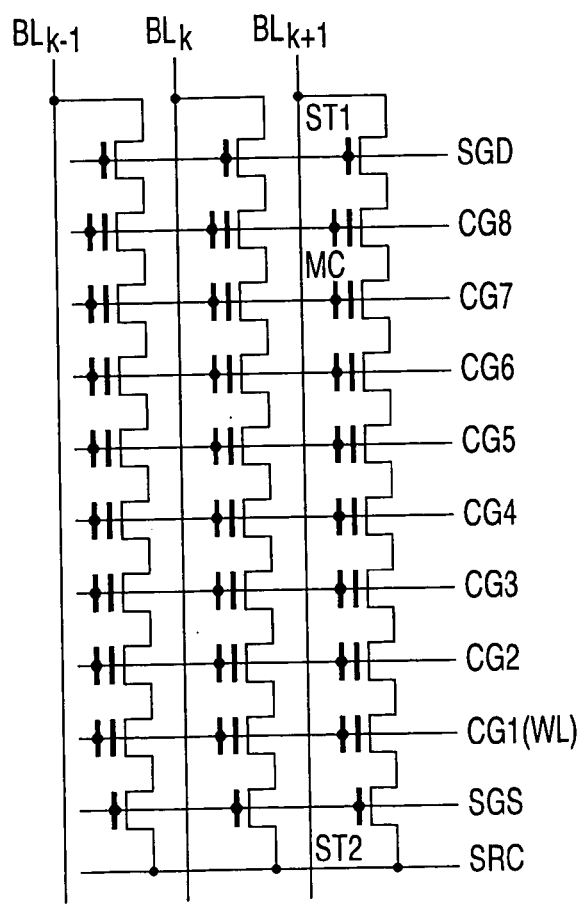
FIG. 17 is a circuit diagram showing a general NAND type EEPROM.
Figure 18:
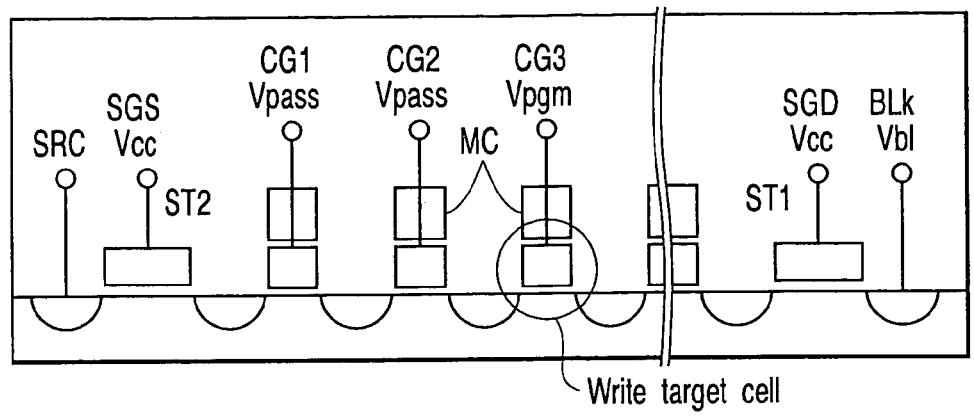
FIG. 18 is a diagram showing an example of a potential in a case where data is written in the memory cell of FIG. 17.

First, a general NAND type EEPROM will be described with reference to FIGS. 17, 18. FIG. 17 shows a circuit constitution of the NAND type EEPROM, and FIG. 18 shows an example of a potential in a case where data is written in the memory cell in this NAND type EEPROM. In FIGS. 17 and 18, the same components are denoted with the same reference numerals.

In the NAND type EEPROM, a plurality of memory rows are disposed. In each memory row, a plurality of cell transistors which are memory cells MC are connected in series, a selection gate ST1 is connected between one end of the row and a bit line BL, and a selection gate ST2 is connected between the other end of the row and a source line SRC.

A predetermined gate potential Vsg is applied to a selection gate line SGD on the side of the bit line BL at a data write time. A sufficiently low potential Vbl is supplied to the bit line BL. The gate potential Vsg is set to a potential at which the selection gate ST1 can be sufficiently turned on with respect to Vbl. When Vbl is supplied to the bit line, the selection gate ST1 turns on, and Vbl is transmitted to the cell transistor. Therefore, a channel potential of the cell transistor sufficiently drops, and the data is written.

In the general EEPROM, at the data write time, capacitive coupling between the control gate and the floating gate is used in either an operation for applying a write potential Vpgm to a selected word line WL (CG3 in FIG. 18) to write data into the cell or an operation for applying a transfer potential Vpass to a non-selected word line WL (except CG3 in FIG. 18) to form a channel.

Figure 19:
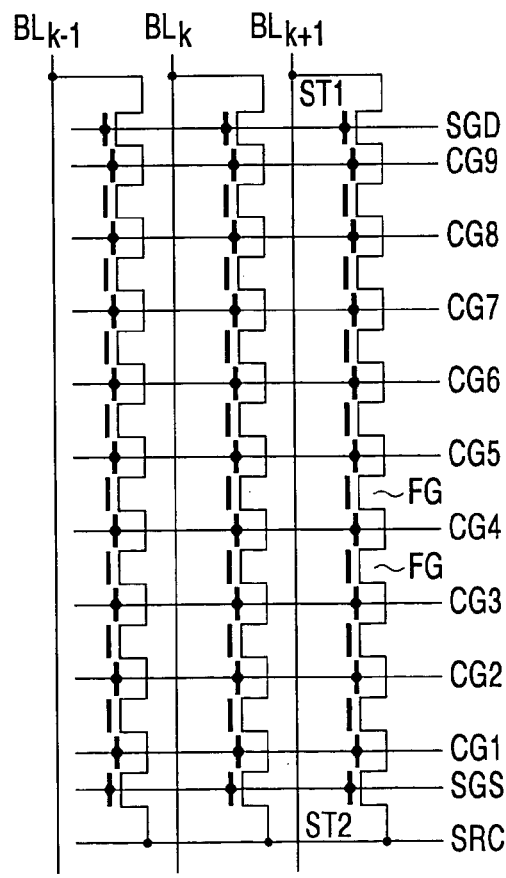
FIG. 19 is a circuit diagram showing a constitution of the nonvolatile semiconductor memory device according to the first to fifth embodiments.

FIG. 19 shows a circuit constitution of the NAND type nonvolatile semiconductor memory device in which a plurality of memory cells are connected in series according to the first to fifth embodiments, and FIG. 20 shows an example of a potential applied to each part in a case where the data is written, together with a schematic section of the circuit.

As described above, a floating gate FG shares two control gates CG, and the floating gate FG is selected by two control gates CG. That is, the floating gate FG is driven by the capacitive coupling with two control gates CG.

At the data write time, the predetermined gate potential Vsg is applied to the selection gate line SGD on the side of the bit line BL, and the selection gate ST1 is turned on. On the other hand, a low gate potential, for example, 0 V is applied to a selection gate line SGS on a source line SRC side, and the selection gate ST2 is turned off. Furthermore, a sufficient low potential Vbl is supplied to the bit line BL. The potential Vsg of the selection gate line SGD is set to such a potential that the selection gate ST1 can be sufficiently turned on with respect to Vbl of the bit line BL. For example, the equal write potential Vpgm is applied to two control gates CG positioned attached to the floating gate FG of the write target cell in which the data is written, and the substrate (P-type substrate) is set, for example, to 0 V. This equivalent circuit of the write target cell is shown in FIG. 21. In this state, charges are injected into the floating gate FG from the substrate.

As described in the first to fifth embodiments, the capacitance ratio can be increased regardless of the micronizing of the device, and Vpgm can be reduced as compared with the prior art.

It is to be noted that the potentials applied to each control gate CG and selection gates SGD, SGS are generated by a row decoder circuit which is a control gate driving circuit.

In the write operation, a case where the equal voltage is supplied to two control gates CG to drive the floating gate FG has been described. However, different potentials may also be supplied to two control gates CG.

FIG. 22 shows the equivalent circuit of the write target cell in a case where Vpgm is supplied to one control gate CG, and 0 V is supplied to the other control gate CG. In FIG. 22, it is assumed that a capacitance ratio of Cip to Ctox is 1.5:1 and no charge is injected into the floating gate FG in a neutral threshold voltage and the existing threshold voltage is 0 V.

The potential Vfg of the floating gate FG shown in FIG. 21 is as follows:

$$Vfg = Vpgm \times 2 \times Cip / (2 \times Cip + Ctox)$$
$$= 0.75 \times Vpgm$$

On the other hand, the potential Vfg of the floating gate FG shown in FIG. 22 is as follows:

$$Vfg = Vpgm \times Cip / (2 \times Cip + Ctox)$$
$$= 0.375 \times Vpgm$$

In this manner, when the potential of one of two control gates CG is changed, the capacitance ratio can be largely controlled.

Figure 23:
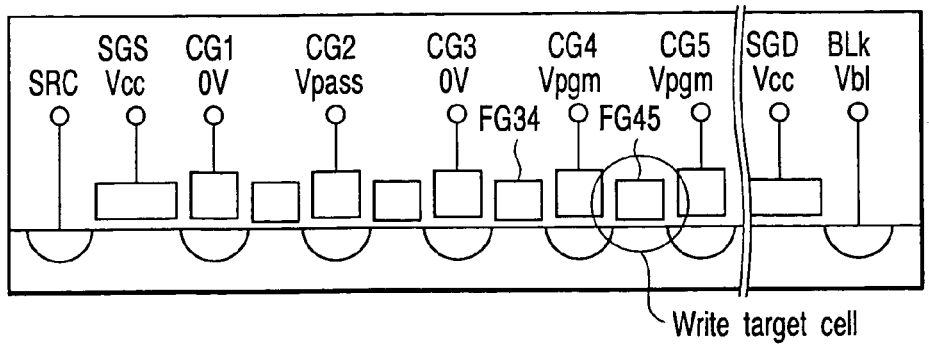
FIG. 23 is a diagram showing an example of the writing of the data using the potential setting shown in FIG. 22.

FIG. 23 shows an example of the writing of the data using the above-described characteristics. In FIG. 23, Vpgm are applied to the control gates CG on the opposite sides of the write target cell. By the use of the above-described assumption, a potential of 0.75×Vpgm is applied to the floating gate FG of the write target cell. While 0 V is applied to one of two control gates CG positioned on the left side of the write target cell, and Vpgm is applied to the other control gate. Therefore, a potential of 0.375×Vpgm is applied to the floating gate FG of the cell positioned on the left side of the write target cell. Therefore, an electric field stress to the cell disposed on the left side is ½ of that of the floating gate FG of the selected cell, which is sufficient for suppressing any write error. A predetermined potential Vpass for boosting the channel potential is applied to the control gate CG2 further distant from the selected cell. At an actual device operation time, the potentials of the control gates CG are appropriately combined in consideration of write characteristics, channel boosting characteristics, potential transfer characteristics and the like.

Figure 24:
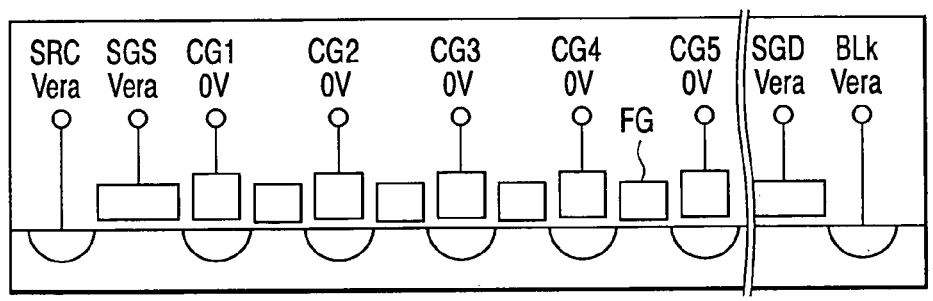
FIG. 24 is a diagram showing an example of a potential applied to each part in a case where the data is erased in the nonvolatile semiconductor memory device according to the first to fifth embodiments.

FIG. 24 shows a cross-sectional view of the nonvolatile semiconductor memory device according to the first to fifth embodiments, and shows an example of the potential applied to each part in a case where the data is erased.

When the data is erased, the substrate (P-type substrate) on which the memory cells are formed is boosted to an erase potential Vera. Moreover, the diffusion layer connected to the bit line BL and source line SRC and the selector gates SGS, SGD are boosted to the potential Vera equal to that of the substrate in order to prevent collapse. Furthermore, a sufficiently low potential, for example, 0 V is supplied to the control gate CG positioned adjacent to the cell to be erased. Then, the charges are pulled toward the boosted substrate from the floating gate FG, and the data is erased.

It is to be noted that the control gate CG is floating state in a non-erased cell. In this case, the potential of the control gate CG is boosted to the substrate potential by the capacitive coupling with the substrate, and the data is inhibited from being erased.

In this manner, even in the memory having the cell structure in which the control gates CG are disposed on the opposite sides of the floating gate FG, the data can be securely erased.

Figure 25:
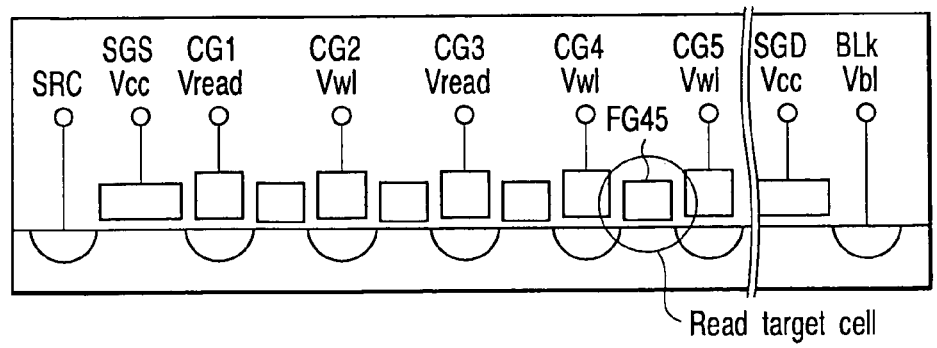
FIG. 25 is a diagram showing an example of a potential applied to each part in a case where the data is read in the nonvolatile semiconductor memory device according to the first to fifth embodiments.

FIG. 25 shows a cross-sectional view of the nonvolatile semiconductor memory device according to the first to fifth embodiments, and shows an example of the potential applied to each part in a case where the data is read.

In FIG. 25, read voltages Vwl are supplied to two control gates CG (CG4, CG5) adjacent to the floating gate FG (FG45) of a read target cell. The read voltage Vwl is preferably set to an appropriate potential in consideration of the write characteristics, data holding characteristics, an operation range of a cell transistor threshold voltage and the like. Assuming that a read voltage Vwl=0 V is set, a potential of 0 V is applied to the floating gate FG of the read cell.

On the other hand, a potential Vread for passing a cell current is applied to the control gate CG further adjacent to two control gates CG positioned on the opposite sides of the read target cell. The potential Vread is preferably set to an appropriate potential in order to remove an influence of the non-selected cell connected to the read target cell and to judge the threshold voltage of the read target cell.

The bit line BL is connected to a sense amplifier circuit having a latch function, and the threshold voltage of the read target cell is judged in the sense amplifier circuit to sense the data at the read time. Here, at the read time, the threshold voltage is judged with respect to only the cell in which both the control gates CG disposed on the opposite sides of the cell indicate a read voltage Vwl. On the other hand, the cell in which the potentials of two control gates CG indicate a combination different from the above-described combination is brought into an on-state regardless of the stored data.

Figure 26:
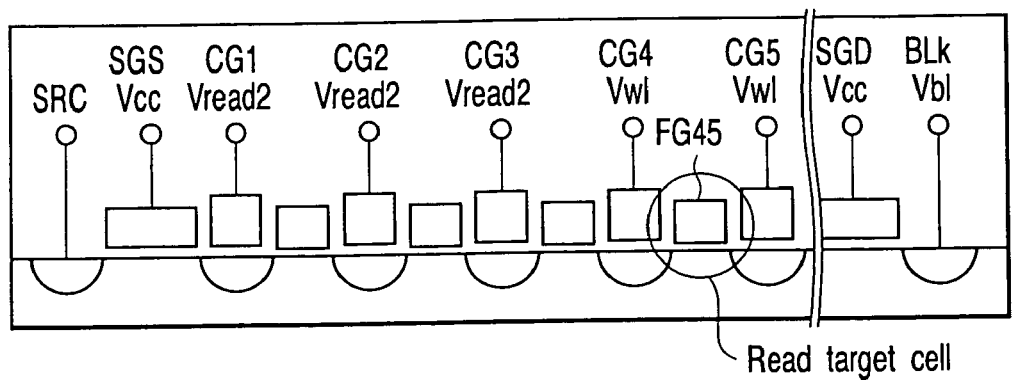
FIG. 26 is a diagram showing another example of a potential applied to each part in a case where the data is read in the nonvolatile semiconductor memory device according to the first to fifth embodiments.

FIG. 26 shows a cross-sectional view of the nonvolatile semiconductor memory device according to the first to fifth embodiments, and shows another example of the potential applied to each part in a case where the data is read.

In this example, read voltages Vwl are supplied to two control gates CG (CG4, CG5) adjacent to the floating gate FG (FG45) of the read target cell. A potential Vread2 for passing the cell current is applied to the other control gate CG (CG1, CG2, etc.).

Additionally, in each memory cell row of FIG. 19, a control gate CG9 positioned in an endmost portion on a bit line BL side and adjacent to the selector gate ST1 contacts the selector gate ST1 via the inter-gate insulation film. Therefore, when a high voltage is applied to the selection gate ST1 at a write time or the like, there is a possibility that a withstand pressure defect occurs with the selection gate ST1. Then, a voltage lower than that of the other control gate is applied to the control gate positioned in the endmost portion in the memory cell row, for example, CG9 in FIG. 19. In this manner, a write speed into the floating gate of the memory cell positioned in the endmost portion in the memory cell row is retarded. To prevent this, the voltage applied to the control gate positioned in the endmost portion on the bit line BL side in the memory cell row, that is, CG9 in FIG. 19 is set to be lower than a usual voltage only in a case where the data is written in the memory cell positioned in the endmost portion on the bit line BL side in the memory cell row. A voltage to be applied to an inner control gate, that is, CG8 in FIG. 19 is set to be higher than the usual voltage. That is, by the use of a principle shown in FIG. 22, a withstand voltage between the control gate and the selection gate is prevented from dropping, and the data can be written into the memory cell positioned in the endmost portion on the bit line BL side in the memory cell row at a speed equal to that at a time when the data is written into another memory cell.

On the other hand, in FIG. 19, at a write time of the data, a low potential, for example, 0 V is applied to the gate of the selection gate ST2 connected to the source line SRC, and the selection gate ST2 is turned off. Here, the control gate CG1 positioned in the endmost portion on the source line SRC side and adjacent to the selection gate ST2 also contacts the selection gate ST2 via the inter-gate insulation film. Therefore, when a high voltage is applied to the control gate CG1 at the write time or the like, there is a possibility that the potential of the selection gate line SGS floats from 0 V by the capacitive coupling between the control gate and the selection gate ST2. Accordingly, at the data write time, the selection gate ST2 which should be originally turned off is not turned off, and a possibility occurs that the current flows and sufficient write cannot be performed. Then, by the application of a voltage lower than that of the other control gate to the control gate positioned in the endmost portion on the source line SRC side in the memory cell row, for example, CG1 in FIG. 19, the potential of the selection gate line SGS is inhibited from rising. Additionally, in this case, the writing speed into the floating gate of the memory cell positioned in the endmost portion on the source line SRC side in the memory cell row is retarded. To prevent this, only in a case where the data is written into the memory cell positioned in the endmost portion on the source line SRC side in the memory cell row, the voltage to be applied to the control gate positioned in the endmost portion on the source line SRC side in the memory cell row, that is, CG1 in FIG. 19 is set to be lower than the usual voltage, and a voltage applied to the inner control gate, that is, CG2 in FIG. 19 is set to be higher than the usual voltage. That is, by the use of the principle shown in FIG. 22, the potential of the selection gate line SGS is prevented from rising, and data can be sufficiently written even in the memory cell positioned in the endmost portion on the source line SRC side in the memory cell row.

Figure 27:
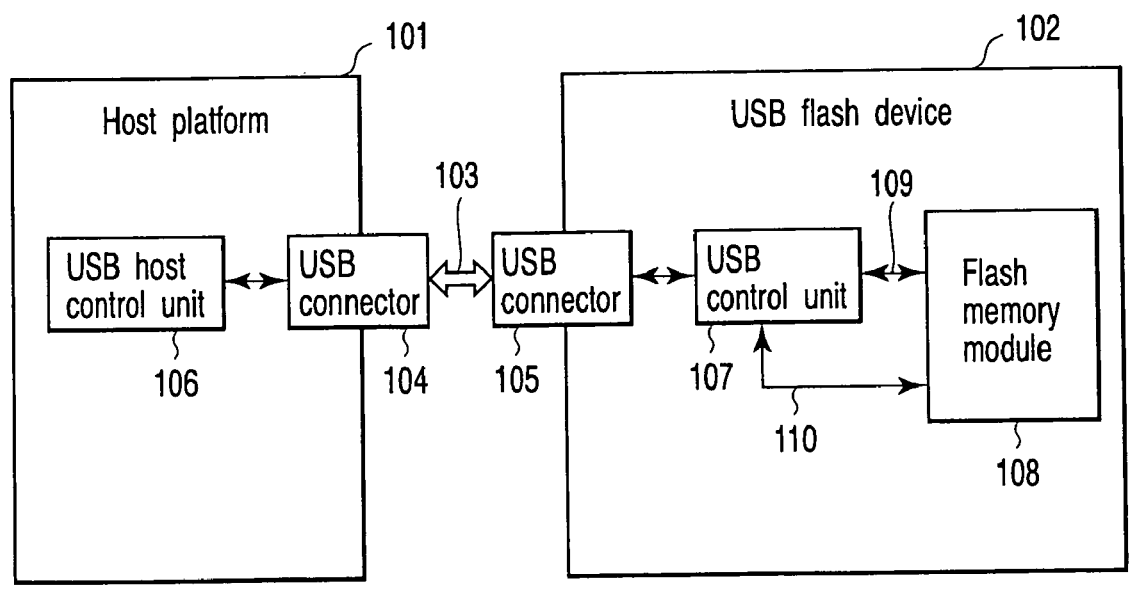
FIG. 27 is a block diagram showing a constitution of an application example of the present invention.

Next, an application example of the nonvolatile semiconductor memory device of the present invention will be described. FIG. 27 is a block diagram showing a schematic constitution of a flash memory system to which the nonvolatile semiconductor memory device of the present invention is applied. As shown, the flash memory system of the application example comprises a host platform 101 and a universal serial bus (USB) flash device 102.

The host platform 101 is connected to the USB flash device 102 via a USB cable 103. The host platform 101 is connected to the USB cable 103 via a USB host connector 104, and the USB flash device 102 is connected to the USB cable 103 via a USB flash device connector 105. The host platform 101 includes a USB host control unit 106 which controls packet transmission on the USB bus 103.

The USB flash device 102 includes: a USB flash device control unit 107 which controls other elements in the device 102 and which also controls an interface of the device 102 into the USB bus 103; the USB flash device connector 105; and at least a flash memory module 108 including the nonvolatile semiconductor memory device of the present invention.

When the USB flash device 102 is connected to the host platform 101, a standard USB listing process starts. In the process, the host platform 101 recognizes the USB flash device 102 to select a communication mode with the USB flash device 102, and transfers/receives data with respect to the USB flash device 102 via a FIFO buffer, which is referred to as an end point, and in which transfer data is stored. The host platform 101 recognizes physical or electrical state changes such as detachment/attachment of the USB flash device 102 via the other end point, and receives a packet to be received, if any.

When the host platform 101 sends a request packet to the USB host control unit 106 to request for services from the USB flash device 102. The USB host control unit 106 transmits the packet onto the USB cable 103. When the USB flash device 102 has an end point that has received the request packet, the requests are accepted by the USB flash device control unit 107.

The USB flash device control unit 107 performs various operations such as read, write, and erase of the data with respect to the flash memory module 108. Moreover, basic USB functions such as acquisition of a USB address are supported. The USB flash device control unit 107 controls the flash memory module 108 via a control line 109 which controls an output of the flash memory module 108, or various signals such as a chip enable signal/CE and a read/write signal. The flash memory module 108 is connected to the USB flash device control unit 107 via an address data bus 110. The address data bus 110 transfers a command of read, write, or erase with respect to the flash memory module 108, and address and data of the flash memory module 108.

To inform the host platform 101 of results and states with respect to various operations required by the host platform 101, the USB flash device 102 transmits a state packet using a state end point (end point 0). In this process, the host platform 101 checks whether or not there is a state packet (poling), and the USB flash device 102 returns a blank packet, or the state packet itself, when there is no packet indicating a new state message.

Various functions of the USB flash device can be carried out as described above. It is to be noted that in FIG. 27, the USB cable 103 may be omitted to directly connect the connector 104 to the connector 105.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents. For example, a case where a plurality of memory cells are connected in series, and connected to the NAND type has been described with reference to FIG. 19, but a plurality of memory cell transistors may also be connected to an AND type.

What is claimed is:

1. A nonvolatile semiconductor memory device comprising:

a memory cell including a floating gate constituted of a first conductive layer formed on a semiconductor substrate via a gate insulation film, a pair of first diffusion layers which are source or drain regions formed in the substrate positioned on opposite sides of the floating gate, first and second control gates constituted of second conductive, layers formed on the opposite aides of the floating gate to drive the floating gate, and an inter-gate insulation film formed between the first and second control gates and the floating gate; and a selection transistor for selecting the memory cell, including a selection gate•wiring including a first portion constituted of the same conductive layer as the first conductive layer, disposed adjacent to one of the first and second control gates via the inter-gate insulation film, and formed on the substrate via the gate insulation film, and a second portion constituted of the same conducive layer as the second conductive layer, disposed adjacent to the first portion, electrically connected to the first portion, and formed on the substrate via an insulation film, and a second diffusion layer formed in the substrate, facing the second portion of the selection gate•wiring.

2. The nonvolatile semiconductor memory device according to clam 1, wherein the selection transistor further comprises:

a third portion constituted of the same conductive layer as the first conductive layer, disposed adjacent to the second portion, electrically connected to the second portion, and formed on the substrate via the gate insulation film; and a third diffusion layer formed in the substrate on a side of the third portion opposite to a side on which the second diffusion layer is formed.

3. The nonvolatile semiconductor memory device according to claim 1, wherein the inter-gate insulation film is extended to a position between each of the first and second control gates and the first diffusion layer.

4. The nonvolatile semiconductor memory device according to claim 1, further comprising:

a trench which is formed in the substrate to extend in a direction parallel to an arrangement direction of the first and second diffusion layers; and an insulation film which is termed in the trench.

5. The nonvolatile semiconductor memory device according to claim 1, wherein metal salicide layers are formed on the first and second control gates.

6. The nonvolatile semiconductor memory device according to claim 1, wherein each of the first and second conductive layers is formed of polysilicon.

7. The nonvolatile semiconductor memory device according to claim 1, wherein each of the first and second conductive layers comprises one of titanium, tungsten, and titanium nitride, or a stacked film of at least two of them.

8. The nonvolatile semiconductor memory device according to claim 1, wherein each of the first and second conductive layers comprises a salicide structure of titanium, cobalt, or nickel metal.

9. The nonvolatile semiconductor memory device according to claim 1, wherein the gate insulation film comprises one of silicon oxide, silicon nitride, aluminum oxide, hafnium oxide, and zirconia oxide, or a stacked film of at least two of them.

10. The nonvolatile semiconductor, memory device according to claim 1, wherein the inter-gate insulation film comprises one of silicon oxide, silicon nitride, aluminum oxide, hafnium oxide, and zirconia oxide, or a stacked film of at least two of them.

11. The nonvolatile semiconductor memory device according to claim 1, wherein a plurality of memory cells are arranged and connected to a NAND type.

12. The nonvolatile semiconductor memory device according to claim 1, wherein a plurality of memory cells are arranged and connected to an AND type.

* * * * *